(12) United States Patent
Wu et al.

(10) Patent No.: US 9,059,076 B2
(45) Date of Patent: Jun. 16, 2015

(54) GATE DRIVERS FOR CIRCUITS BASED ON SEMICONDUCTOR DEVICES

(71) Applicant: Transphorm Inc., Goleta, CA (US)

(72) Inventors: Yifeng Wu, Goleta, CA (US); Liang Zhou, Goleta, CA (US); Zhan Wang, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 14/222,992

(22) Filed: Mar. 24, 2014

(65) Prior Publication Data

US 2014/0292395 A1 Oct. 2, 2014

Related U.S. Application Data

(60) Provisional application No. 61/807,258, filed on Apr. 1, 2013.

(51) Int. Cl.
| | |
|---|---|
| H03K 3/00 | (2006.01) |
| H01L 29/20 | (2006.01) |
| H03K 17/16 | (2006.01) |
| H01L 29/40 | (2006.01) |
| H01L 29/778 | (2006.01) |
| H03K 17/687 | (2006.01) |
| H01L 29/423 | (2006.01) |

(52) U.S. Cl.
CPC .......... *H01L 29/2003* (2013.01); *H03K 17/163* (2013.01); *H03K 2017/6875* (2013.01); *H01L 29/402* (2013.01); *H01L 29/4236* (2013.01); *H01L 29/7786* (2013.01)

(58) Field of Classification Search
USPC ....................................................... 327/108
See application file for complete search history.

(56) References Cited

U.S. PATENT DOCUMENTS

| | | |
|---|---|---|
| 4,321,489 A | 3/1982 | Higuchi et al. |
| 4,384,287 A | 5/1983 | Sakuma |
| 4,665,508 A | 5/1987 | Chang |
| 4,728,826 A | 3/1988 | Einzinger et al. |

(Continued)

FOREIGN PATENT DOCUMENTS

| | | |
|---|---|---|
| CN | 101978589 | 2/2011 |
| CN | 102165694 | 8/2011 |

(Continued)

OTHER PUBLICATIONS

U.S. Appl. No. 11/856,695, filed Sep. 17, 2007, Gallium Nitride Diodes and Integrated Components.

(Continued)

*Primary Examiner* — Daniel Rojas
(74) *Attorney, Agent, or Firm* — Fish & Richardson P.C.

(57) ABSTRACT

An electronic component includes a switching device comprising a source, a gate, and a drain, the switching device having a predetermined device switching rate. The electronic component further includes a gate driver electrically connected to the gate and coupled between the source and the gate of the switching device, the gate driver configured to switch a gate voltage of the switching device at a gate driver switching rate. The gate driver is configured such that in operation, an output current of the gate driver cannot exceed a first current level, wherein the first current level is sufficiently small to provide a switching rate of the switching device in operation to be less than the predetermined device switching rate.

27 Claims, 15 Drawing Sheets

(56) References Cited

U.S. PATENT DOCUMENTS

| | | |
|---|---|---|
| 4,808,853 A | 2/1989 | Taylor |
| 5,198,964 A | 3/1993 | Ito et al. |
| 5,379,209 A | 1/1995 | Goff |
| 5,493,487 A | 2/1996 | Close et al. |
| 5,637,922 A | 6/1997 | Fillion et al. |
| 5,789,951 A | 8/1998 | Shen et al. |
| 5,812,010 A | 9/1998 | Houk |
| 5,952,856 A | 9/1999 | Horiguchi et al. |
| 6,008,684 A | 12/1999 | Ker et al. |
| 6,107,844 A | 8/2000 | Berg et al. |
| 6,130,831 A | 10/2000 | Matsunaga |
| 6,172,550 B1 | 1/2001 | Gold et al. |
| 6,333,617 B1 | 12/2001 | Itabashi et al. |
| 6,395,593 B1 | 5/2002 | Pendharkar et al. |
| 6,521,940 B1 | 2/2003 | Vu et al. |
| 6,650,169 B2 | 11/2003 | Faye et al. |
| 6,781,423 B1 * | 8/2004 | Knoedgen .................... 327/110 |
| 6,900,657 B2 | 5/2005 | Bui et al. |
| 6,975,023 B2 | 12/2005 | Oliver et al. |
| 7,116,567 B2 | 10/2006 | Shelton et al. |
| 7,304,331 B2 | 12/2007 | Saito et al. |
| 7,378,883 B1 | 5/2008 | Hsueh |
| 7,443,648 B2 | 10/2008 | Cutter et al. |
| 7,449,730 B2 | 11/2008 | Kuraguchi |
| 7,453,107 B1 | 11/2008 | Kapoor |
| 7,477,082 B2 | 1/2009 | Fukazawa |
| 7,501,669 B2 | 3/2009 | Parikh et al. |
| 7,548,112 B2 | 6/2009 | Sheppard |
| 7,612,602 B2 | 11/2009 | Yang et al. |
| 7,639,064 B2 | 12/2009 | Hsiao et al. |
| 7,714,360 B2 | 5/2010 | Otsuka et al. |
| 7,719,055 B1 | 5/2010 | McNutt et al. |
| 7,746,020 B2 | 6/2010 | Schnetzka et al. |
| 7,755,108 B2 | 7/2010 | Kuraguchi |
| 7,795,642 B2 | 9/2010 | Suh et al. |
| 7,804,328 B2 | 9/2010 | Pentakota et al. |
| 7,851,825 B2 | 12/2010 | Suh et al. |
| 7,855,401 B2 | 12/2010 | Sheppard et al. |
| 7,875,907 B2 | 1/2011 | Honea et al. |
| 7,875,914 B2 | 1/2011 | Sheppard |
| 7,884,394 B2 | 2/2011 | Wu et al. |
| 7,884,395 B2 | 2/2011 | Saito |
| 7,898,004 B2 | 3/2011 | Wu et al. |
| 7,906,837 B2 | 3/2011 | Cabahug et al. |
| 7,915,643 B2 | 3/2011 | Suh et al. |
| 7,920,013 B2 | 4/2011 | Sachdev et al. |
| 7,939,391 B2 | 5/2011 | Suh et al. |
| 7,965,126 B2 | 6/2011 | Honea et al. |
| 8,013,580 B2 | 9/2011 | Cervera et al. |
| 8,089,139 B2 | 1/2012 | Shi et al. |
| 8,138,529 B2 | 3/2012 | Wu |
| 8,193,562 B2 | 6/2012 | Suh et al. |
| 8,237,198 B2 | 8/2012 | Wu et al. |
| 8,289,065 B2 | 10/2012 | Honea et al. |
| 8,344,424 B2 | 1/2013 | Suh et al. |
| 8,389,977 B2 | 3/2013 | Chu et al. |
| 8,390,000 B2 | 3/2013 | Chu et al. |
| 8,455,931 B2 | 6/2013 | Wu |
| 8,493,129 B2 | 7/2013 | Honea et al. |
| 8,508,281 B2 | 8/2013 | Honea et al. |
| 8,519,438 B2 | 8/2013 | Mishra et al. |
| 8,531,232 B2 | 9/2013 | Honea et al. |
| 8,541,818 B2 | 9/2013 | Wu et al. |
| 8,592,974 B2 | 11/2013 | Wu |
| 8,598,937 B2 | 12/2013 | Lal et al. |
| 8,624,662 B2 | 1/2014 | Parikh et al. |
| 8,633,518 B2 | 1/2014 | Suh et al. |
| 8,643,062 B2 | 2/2014 | Parikh et al. |
| 8,648,643 B2 | 2/2014 | Wu |
| 8,692,294 B2 | 4/2014 | Chu et al. |
| 8,716,141 B2 | 5/2014 | Dora et al. |
| 8,742,459 B2 | 6/2014 | Mishra et al. |
| 8,742,460 B2 | 6/2014 | Mishra et al. |
| 2001/0044640 A1 | 11/2001 | Akiyama et al. |
| 2002/0125920 A1 | 9/2002 | Stanley |
| 2003/0178654 A1 | 9/2003 | Thornton |
| 2004/0120090 A1 | 6/2004 | Galli et al. |
| 2004/0178831 A1 | 9/2004 | Li et al. |
| 2005/0052221 A1 | 3/2005 | Kohnotoh et al. |
| 2005/0067716 A1 | 3/2005 | Mishra et al. |
| 2005/0077947 A1 | 4/2005 | Munzer et al. |
| 2005/0146310 A1 | 7/2005 | Orr |
| 2005/0189561 A1 | 9/2005 | Kinzer et al. |
| 2005/0189562 A1 | 9/2005 | Kinzer et al. |
| 2005/0218964 A1 | 10/2005 | Oswald et al. |
| 2006/0033122 A1 | 2/2006 | Pavier et al. |
| 2006/0043499 A1 | 3/2006 | De Cremoux et al. |
| 2006/0060871 A1 | 3/2006 | Beach |
| 2006/0102929 A1 | 5/2006 | Okamoto et al. |
| 2006/0108605 A1 | 5/2006 | Yanagihara et al. |
| 2006/0176007 A1 | 8/2006 | Best |
| 2006/0237825 A1 | 10/2006 | Pavier et al. |
| 2006/0238234 A1 | 10/2006 | Benelbar et al. |
| 2006/0261473 A1 | 11/2006 | Connah et al. |
| 2006/0262581 A1 | 11/2006 | Lin |
| 2007/0018210 A1 | 1/2007 | Sheppard |
| 2007/0080672 A1 | 4/2007 | Yang |
| 2007/0090373 A1 | 4/2007 | Beach et al. |
| 2007/0146045 A1 | 6/2007 | Koyama |
| 2007/0210329 A1 | 9/2007 | Goto |
| 2007/0278518 A1 | 12/2007 | Chen et al. |
| 2008/0017998 A1 | 1/2008 | Pavio |
| 2008/0018366 A1 | 1/2008 | Hanna |
| 2008/0121876 A1 | 5/2008 | Otsuka et al. |
| 2008/0122418 A1 | 5/2008 | Briere et al. |
| 2008/0136390 A1 | 6/2008 | Briere |
| 2008/0158110 A1 | 7/2008 | Iida et al. |
| 2008/0191342 A1 | 8/2008 | Otremba |
| 2008/0203559 A1 | 8/2008 | Lee et al. |
| 2008/0248634 A1 | 10/2008 | Beach |
| 2008/0283844 A1 | 11/2008 | Hoshi et al. |
| 2009/0032879 A1 | 2/2009 | Kuraguchi |
| 2009/0050936 A1 | 2/2009 | Oka |
| 2009/0072269 A1 | 3/2009 | Suh et al. |
| 2009/0167411 A1 | 7/2009 | Machida et al. |
| 2009/0180304 A1 | 7/2009 | Bahramian et al. |
| 2009/0201072 A1 | 8/2009 | Honea et al. |
| 2009/0215230 A1 | 8/2009 | Muto et al. |
| 2009/0218598 A1 | 9/2009 | Goto |
| 2009/0236728 A1 | 9/2009 | Satou et al. |
| 2009/0278513 A1 | 11/2009 | Bahramian et al. |
| 2009/0315594 A1 | 12/2009 | Pentakota et al. |
| 2010/0067275 A1 | 3/2010 | Wang et al. |
| 2010/0073067 A1 | 3/2010 | Honea |
| 2010/0097119 A1 | 4/2010 | Ma et al. |
| 2010/0117095 A1 | 5/2010 | Zhang |
| 2011/0019450 A1 | 1/2011 | Callanan et al. |
| 2011/0025397 A1 | 2/2011 | Wang et al. |
| 2011/0121314 A1 | 5/2011 | Suh et al. |
| 2011/0169549 A1 | 7/2011 | Wu |
| 2011/0227095 A1 | 9/2011 | Treu et al. |
| 2012/0153390 A1 | 6/2012 | Mishra et al. |
| 2012/0306464 A1 | 12/2012 | Hirler et al. |

FOREIGN PATENT DOCUMENTS

| | | |
|---|---|---|
| CN | 102308387 | 1/2012 |
| CN | 103477543 | 12/2013 |
| EP | 2 188 842 | 5/2010 |
| EP | 2 243 213 | 10/2010 |
| EP | 2 394 303 | 12/2011 |
| JP | 5-075040 | 3/1993 |
| JP | 6-067744 | 3/1994 |
| JP | 2000-101356 | 4/2000 |
| JP | 2000-124358 | 4/2000 |
| JP | 2003-244943 | 8/2003 |
| JP | 2003-338742 | 11/2003 |
| JP | 2004-281454 | 10/2004 |
| JP | 2006-033723 | 2/2006 |
| JP | 2006-173754 | 6/2006 |
| JP | 2007-036218 | 2/2007 |
| JP | 2007-215331 | 8/2007 |
| JP | 2007-294769 | 11/2007 |
| JP | 2008-199771 | 8/2008 |

(56) References Cited

FOREIGN PATENT DOCUMENTS

| JP | 2010-539712 | 12/2010 |
|----|----|----|
| JP | 2011-512119 | 4/2011 |
| JP | 2012-517699 | 8/2012 |
| TW | 200941920 | 10/2009 |
| TW | 201027912 | 7/2010 |
| TW | 201036155 | 10/2010 |
| TW | 201126686 | 8/2011 |
| TW | 201143017 | 12/2011 |
| TW | 201332085 | 8/2013 |
| TW | 201347143 | 11/2013 |
| WO | WO 2009/036266 | 3/2009 |
| WO | WO 2009/102732 | 8/2009 |
| WO | WO 2010/039463 | 4/2010 |
| WO | WO 2010/090885 | 8/2010 |
| WO | WO 2011/053981 | 5/2011 |
| WO | WO 2011/085260 | 7/2011 |
| WO | WO 2011/097302 | 8/2011 |
| WO | WO 2013/085839 | 6/2013 |

OTHER PUBLICATIONS

U.S. Appl. No. 14/108,642, filed Dec. 17, 2013, Gallium Nitride Power Devices.
U.S. Appl. No. 60/971,721, filed Sep. 12, 2007, III-Nitride Bilateral Switches.
U.S. Appl. No. 60/972,467, filed Sep. 14, 2007, Growing N-Polar III-Nitride Structures.
U.S. Appl. No. 12/209,504, filed Sep. 12, 2008, Growing N-Polar III-Nitride Structures.
U.S. Appl. No. 60/972,481, filed Sep. 14, 2007, III-Nitride Devices with Recessed Gates.
U.S. Appl. No. 61/012,755, filed Dec. 10, 2007, Insulated Gate E-Mode Transistors.
U.S. Appl. No. 61/028,133, filed Feb. 12, 2008, Bridge Circuits and their Components.
U.S. Appl. No. 13/887,204, filed May 3, 2013, Bridge Circuits and their Components.
U.S. Appl. No. 13/954,772, filed Jul. 30, 2013, Enhancement Mode III-NHEMTs.
U.S. Appl. No. 61/099,451, filed Sep. 23, 2008, Inductive Load Power Switching Circuits.
U.S. Appl. No. 13/959,483, filed Aug. 5, 2013, Inductive Load Power Switching Circuits.
U.S. Appl. No. 13/973,890, filed Aug. 22, 2013, Semiconductor Heterostructure Diodes.
U.S. Appl. No. 14/063,438, filed Oct. 25, 2013, Package Configurations for Low EMI Circuits.
U.S. Appl. No. 13/756,284, filed Jan. 31, 2013, Methods of Forming Reverse Side Engineered III-Nitride Devices.
U.S. Appl. No. 14/262,649, filed Apr. 25, 2014, High Voltage III-Nitride Semiconductor Devices.
U.S. Appl. No. 14/178,701, filed Feb. 12, 2014, Semiconductor Devices with Field Plates.
U.S. Appl. No. 12/684,838, filed Jan. 8, 2010, Electronic Devices and Components for High Efficiency Power Circuits.
U.S. Appl. No. 14/058,089, filed Oct. 18, 2013, Semiconductor Electronic Components and Circuits.
U.S. Appl. No. 14/260,808, filed Apr. 24, 2014, Transistors with Isolated Regions.
U.S. Appl. No. 12/953,769, filed Nov. 24, 2010, Layer Structures for Controlling Stress of Heteroepitaxially Grown III-Nitride Layers.
U.S. Appl. No. 13/226,380, filed Sep. 6, 2011, Semiconductor Devices with Guard Rings.
U.S. Appl. No. 14/102,750, filed Dec. 11, 2013, III-N Device Structures and Methods.
U.S. Appl. No. 13/040,524, filed Mar. 4, 2011, Semiconductor Diodes with Low Reverse Bias Currents.
U.S. Appl. No. 14/288,682, filed May 28, 2014, Semiconductor Diodes with Low Reverse Bias Currents.
U.S. Appl. No. 14/211,104, filed Mar. 14, 2014, Electrode Configurations for Semiconductor Devices.
U.S. Appl. No. 61/447,519, filed Feb. 28, 2011, Electronics Components with Reactive Filters.
U.S. Appl. No. 13/403,813, filed Feb. 23, 2012, Electronic Components with Reactive Filters.
U.S. Appl. No. 61/568,022, filed Dec. 7, 2011, Semiconductor Modules and Methods of Forming the Same.
U.S. Appl. No. 13/690,103, filed Nov. 30, 2012, Semiconductor Modules and Methods of Forming the Same.
U.S. Appl. No. 13/366,090, filed Feb. 3, 2012, Buffer Layer Structures Suited for III-Nitride Devices with Foreign Substrates.
U.S. Appl. No. 14/134,878, filed Dec. 19, 2013, Semiconductor Power Modules and Devices.
U.S. Appl. No. 61/621,956, filed Apr. 9, 2012, N-Polar III-Nitride Transistors.
U.S. Appl. No. 13/859,635, filed Apr. 9, 2013, N-Polar III-Nitride Transistors.
U.S. Appl. No. 61/765,635, filed Feb. 15, 2013, Electrodes for Semiconductor Devices and Methods of Forming the Same.
U.S. Appl. No. 14/179,788, filed Feb. 13, 2014, Electrodes for Semiconductor Devices and Methods of Forming the Same.
U.S. Appl. No. 61/791,395, filed Mar. 15, 2013, Carbon Doping Semiconductor Devices.
U.S. Appl. No. 14/208,304, filed Mar. 13, 2014, Carbon Doping Semiconductor Devices.
U.S. Appl. No. 13/799,989, filed Mar. 13, 2013, Enhancement-Mode III-Nitride Devices.
U.S. Appl. No. 61/807,258, filed Apr. 1, 2013, Gate Drivers for Circuits Based on Semiconductor Devices.
U.S. Appl. No. 14/222,992, filed Mar. 24, 2014, Gate Drivers for Circuits Based on Semiconductor Devices.
U.S. Appl. No. 61/844,260, filed Jul. 9, 2013, Multilevel Inverters and their Components.
U.S. Appl. No. 61/856,573, filed Jul. 19, 2013, III-Nitride Transistor Including a P-Type Depleting Layer.
U.S. Appl. No. 14/208,482, filed Mar. 13, 2014, Carbon Doping Semiconductor Devices.
U.S. Appl. No. 13/231,308, filed Sep. 13, 2011, III-N Device Structures Having a Non-Insulating Substrate.
U.S. Appl. No. 14/068,944, filed Oct. 31, 2013, High Power Semiconductor Electronic Components with Increased Reliability.
U.S. Appl. No. 13/535,094, filed Jun. 27, 2012, Semiconductor Devices with Integrated Hole Collectors.
U.S. Appl. No. 13/550,445, filed Jul. 16, 2012, Semiconductor Electronic Components with Integrated Current Limiters.
U.S. Appl. No. 13/551,094, filed Jul. 17, 2012, Contacts for Semiconductor Devices and Methods of Forming the Same.
U.S. Appl. No. 61/672,723, filed Jul. 17, 2012, Devices and Components for Power Conversion Circuits.
U.S. Appl. No. 13/803,912, filed Mar. 14, 2013, Devices and Components for Power Conversion Circuits.
Authorized officer Keon Hyeong Kim, International Search Report and Written Opinion in PCT/US2008/076160 mailed Mar. 18, 2009, 11 pages.
Authorized officer Simin Baharlou, International Preliminary Report on Patentability in PCT/US2008/076160, mailed Mar. 25, 2010, 6 pages.
Authorized officer Jae Woo Wee, International Search Report and Written Opinion in PCT/US2009/033699, mailed Sep. 21, 2009, 11 pages.
Authorized officer Dorothée Müllhausen, International Preliminary Report on Patentability in PCT/US2009/033699, mailed Aug. 26, 2010, 6 pages.
Authorized officer Sung Hee Kim, International Search Report and the Written Opinion in PCT/US2009/057554, mailed May 10, 2010, 13 pages.
Authorized Officer Gijsbertus Beijer, International Preliminary Report on Patentability in PCT/US2009/057554, mailed Mar. 29, 2011, 7 pages.
Authorized officer Sung Chan Chung, International Search Report and Written Opinion for PCT/US2010/021824, mailed Aug. 23, 2010, 9 pages.

(56) References Cited

OTHER PUBLICATIONS

Authorized officer Beate Giffo-Schmitt, International Preliminary Report on Patentability in PCT/US2010/021824, mailed Aug. 18, 2011, 6 pages.
Authorized officer Bon Gyoung Goo, International Search Report and Written Opinion in PCT/US2010/055129, mailed Jul. 1, 2011, 11 pages.
Authorized officer Yolaine Cussac, International Preliminary Report on Patentability in PCT/US2010/055129, mailed May 18, 2012, 6 pages.
Authorized officer Sung Joon Lee, International Search Report and Written Opinion in PCT/US2011/020592, mailed Sep. 19, 2011, 9 pages.
Authorized officer Philippe Bécamel, International Preliminary Report on Patentability in PCT/US2011/020592, mailed Jul. 19, 2012, 7 pages.
Authorized officer Kee Young Park, International Search Report and Written Opinion in PCT/US2011/023485, mailed Sep. 23, 2011, 10 pages.
Authorized officer Nora Lindner, International Preliminary Report on Patentability in PCT/US2011/023485, mailed Aug. 16, 2012, 7 pages.
Chinese First Office Action in Application No. 200980110230.0, mailed Jan. 24, 2014, 18 pages.
Japanese Office action in Application No. 2010-546867, mailed Sep. 24, 2013, 14 pages.
Chen et al., "Single-Chip Boost Converter Using Monolithically Integrated AlGan/GaN Lateral Field-Effect Rectifier and Normally Off HEMT," IEEE Electron Device Letters, May 2009, 30(5):430-432.
Napierala et al., "Selective GaN Epitaxy on Si(111) Substrates Using Porous Aluminum Oxide Buffer Layers," Journal of the Electrochemical Society, 2006. 153(2):G125-G127, 4 pages.
Wu et al., "A 97.8% Efficient GaN HEMT Boost Converter with 300-W Output Power at 1MHz,"Electronic Device Letters, 2008, IEEE, 29(8):824-826.
Authorized officer Kwak in Gu, International Search Report and Written Opinion in PCT/US2012/026810, mailed Jan. 23, 2013, 10 pages.
Authorized officer Lingfei Bai, International Preliminary Report on Patentability in PCT/US2012/026810, mailed Sep. 12, 2013, 6 pages.
Authorized officer Sung Gon Kim, International Search Report and Written Opinion in PCT/US2014/032241, mailed Aug. 11, 2014, 12 pages.
Search Report and Action in TW Application No. 098132132, issued Dec. 6, 2012, 8 pages.

* cited by examiner

GATE DRIVERS FOR CIRCUITS BASED ON SEMICONDUCTOR DEVICES

CROSS-REFERENCE TO RELATED APPLICATION

This application claims priority to U.S. Provisional Application No. 61/807,258, filed on Apr. 1, 2013. The disclosure of the prior application is considered part of and is incorporated by reference in the disclosure of this application.

TECHNICAL FIELD

This invention relates to electronic modules formed of semiconductor devices, and specifically to gate drivers for the semiconductor devices.

BACKGROUND

Power switching circuits such as bridge circuits are commonly used in a variety of applications. A prior art circuit schematic of a 3-phase bridge circuit 100 configured to drive a motor is shown in FIG. 1. Each of the three half bridges 115, 125, and 135 in circuit 100 includes two transistors, 141 and 142, 143 and 144, and 145 and 146, respectively, which are able to block voltage in a first direction and are capable of conducting current in the first direction or optionally in both directions. In applications where the transistors employed in the bridge circuit 10 are only capable of conducting current in one direction, for example when the transistors are silicon IGBTs, an anti-parallel diode (not shown) may be connected to each of the transistors 141-146. The gate voltages of each of transistors 141-146 are applied by gate drivers 151-156, respectively. As shown in FIG. 1, gate drivers 151-156 are each coupled between the gate and source of their respective transistor. Gate drivers 151-156 may each be individual circuits. Or, the gate drivers of each half bridge 115, 125, and 135 can be integrated into a single gate drive circuit. Or alternatively, the gate drivers of all of the transistors 141-146 in the bridge circuit can be integrated into a single gate drive circuit.

Each of transistors 141-146 is capable of blocking a voltage at least as large as the high voltage (HV) source 101 of the circuit 100 when they are biased in the OFF state. That is, when the gate-source voltage $V_{GS}$ applied by the gate drive circuits 151-156 to any of transistors 141-146, respectively, is less than the transistor threshold voltage $V_{th}$, no substantial current flows through the transistor when the drain-source voltage $V_{DS}$ (i.e., the voltage at the drain relative to the source) is between 0V and HV. When biased in the ON state (i.e. with $V_{GS}$ greater than the transistor threshold voltage), the transistors 141-146 are each capable of conducting sufficiently high current for the application in which they are used.

As used herein, the term "blocking a voltage" refers to a transistor, device, or component being in a state for which significant current, such as current that is greater than 0.001 times the average operating current during regular ON-state conduction, is prevented from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the average operating current during regular ON-state conduction.

The transistors 141-146 may be enhancement mode or E-mode transistors (normally off, $V_{th}>0$), or depletion mode or D-mode (normally on, $V_{th}<0$) transistors. In power circuits, enhancement mode devices are typically used to prevent accidental turn on which may cause damage to the devices or other circuit components. Alternatively, the transistors 141-146 can be replaced by a high-voltage D-mode transistor 201 and a low voltage E-mode transistor 202 connected in a cascode configuration 200, as shown in FIG. 2. In prior art cascode device 200 of FIG. 2, the source 211 of D-mode transistor 201 is connected to the drain 216 of E-mode transistor 202, and the gate 212 of D-mode transistor 201 is electrically connected or electrically coupled to the source 214 of E-mode transistor 202. Cascode device 200 is configured to operate as a high-voltage E-mode device, with node 221 functioning as the source, node 222 functioning as the gate, and node 223 functioning as the drain. Referring back to FIG. 1, nodes 117, 118, and 119 are all coupled to one another via inductive loads, i.e., inductive components such as motor coils (not shown in FIG. 1).

As used herein, two or more contacts or other items such as conductive layers or components are said to be "electrically connected" if they are connected by a material which is sufficiently conducting to ensure that the electric potential at each of the contacts or other items is substantially the same or about the same regardless of bias conditions.

FIG. 3A shows prior art half bridge 115 of the full 3-phase motor drive in FIG. 1, along with the winding of the motor (represented by inductive component 321) between nodes 117 and 118. Also shown is transistor 144, into which the motor current feeds. For this phase of power, transistor 144 is continuously ON ($V_{gs144}>V_{th}$) and transistor 142 is continuously OFF ($V_{gs142}<V_{th}$, i.e., $V_{gs142}=0V$ if enhancement mode transistors are used), while transistor 141 is modulated by gate driver 151 with a pulse width modulation (PWM) signal to achieve the desired motor current. FIG. 3B indicates the path of the current 327 during the time that transistor 141 is biased ON. For this bias, the motor current flows through transistors 141 and 144, while no current flows through transistor 142 because transistor 142 is biased OFF, and the voltage at node 117 is close to HV, so transistor 142 blocks a voltage which is close to HV.

Referring to FIG. 3C, when transistor 141 is switched OFF, no current can flow through transistor 141, so the motor current flows in the reverse direction through transistor 142, which can occur whether transistor 142 is biased ON or OFF. Alternatively, an anti-parallel freewheeling diode (not shown) can be connected across transistor 142, in which case the reverse current flows through the freewheeling diode. During such operation, the inductive component 321 forces the voltage at node 117 to a sufficiently negative value to cause reverse conduction through transistor 142, and transistor 141 blocks a voltage which is close to HV.

The mode of switching illustrated in FIGS. 3A-3C and is commonly known as hard-switching. A hard-switching circuit configuration is one in which the switching transistors are configured to have high currents passing through them as soon as they are switched ON, and to have high voltages across them as soon as they are switched OFF. In other words, the transistors are switched ON during periods where non-zero currents flow through the inductive load, so substantial current flows through the transistors immediately or soon after the transistors are switched ON, rather than the current rising gradually. Similarly, the transistors are switched OFF during periods where high voltages must be blocked by the transistors, so substantial voltage is blocked by the transistors immediately or soon after the transistors are switched OFF, rather than the voltage rising gradually. Transistors switched under these conditions are said to be "hard-switched".

For the prior art bridge circuits illustrated in FIGS. 1 and 3A-3C, each of the transistors 141-146 has a maximum switching rate at which the device can switch from the OFF state to the ON state or vice-versa, the maximum switching rate being largely dependent on the particular switching characteristics of the device, but also partially depending on other adjacent components in the circuit. The switching time for the switching of the voltages at the output nodes 161-166 of each of the gate drivers 151-156 can be much less than the switching times of each of their respective switching devices 141-146. Consequently, in the configurations of FIGS. 1 and 3A-3C, for which the outputs 161-166 of gate drivers 151-156 are electrically connected directly to the gates of their respective switching devices 141-146, devices 141-146 switch at their maximum switching rates during circuit operation. Furthermore, in order to maintain stability of the devices 141-146 and of the circuit 100, the maximum output current that can be supplied by the gate drivers 151-156 is chosen to be high. For example, the maximum output current of each of the gate drivers 151-156 is typically chosen to be at least $1/60$ times the maximum rated output current of each of their respective switching devices 141-146.

Although hard-switched circuits tend to be simple to design and operate, hard-switched components tend to exhibit high levels of electro-magnetic interference (EMI) during operation, in particular in high voltage and/or high current applications in which the switching rate of each of the devices is very high. This can lead to circuit instability or catastrophic failure of the devices in the circuit. In particular, for the circuit configurations shown in FIGS. 1 and 3A-3C, if the circuit high voltage (HV) is large (e.g., greater than 300V) and/or the switching devices need to switch large currents (e.g., greater than 5 Amps), the circuits exhibit excessively high levels of EMI, become unstable, and cease to function properly.

Alternative circuit configurations make use of additional passive and/or active components, or alternatively signal timing techniques, to allow the transistors to be "soft-switched". A soft-switching circuit configuration is one in which the switching transistors are configured to be switched ON during zero-current (or near zero-current) conditions and switched OFF during zero-voltage (or near zero-voltage) conditions. Soft-switching methods and configurations have been developed to address the high levels of EMI and associated ringing observed in hard-switched circuits, especially in high current and/or high voltage applications. While soft-switching can in many cases alleviate these problems, the circuitry required for soft switching typically includes many additional components, resulting in increased overall cost and complexity. Soft-switching also typically requires that the circuits be configured to switch only at specific times when the zero-current or zero-voltage conditions are met, hence limiting the control signals that can be applied and in many cases reducing circuit performance. Hence, alternative configurations and methods are desirable for power switching circuits in order to maintain sufficiently low levels of EMI while at the same time maintaining circuit stability.

SUMMARY

Described herein are high-voltage circuits which include high-voltage switching devices. The gate drivers of the switching devices are configured to reduce the switching rates of the switching devices during operation and improve stability of the high-voltage circuits.

In a first aspect, an electronic component includes a switching device comprising a source, a gate, and a drain, the switching device having a predetermined device switching rate. The electronic component further includes a gate driver electrically connected to the gate and coupled between the source and the gate of the switching device, the gate driver configured to switch a gate voltage of the switching device at a gate driver switching rate. The gate driver is configured such that in operation, an output current of the gate driver cannot exceed a first current level, wherein the first current level is sufficiently small to provide a switching rate of the switching device in operation to be less than the predetermined device switching rate.

In a second aspect, an electronic component includes a switching device comprising a source, a gate, and a drain, the switching device being operable to block at least 300V when biased OFF. The electronic component further includes a gate driver coupled between the source and the gate of the switching device, the gate driver configured to switch voltage at an output of the gate driver at a gate driver switching rate. A resistance between the output of the gate driver and the gate of the switching device is less than 5 Ohms, and the gate driver is configured such that in operation, an output current of the gate driver is limited by circuitry of the gate driver such that the output current cannot exceed a first current level. Furthermore, a ratio of the first current level to a maximum rated current of the switching device is less than $1/100$.

In a third aspect, a method of operating an electronic component is described. The electronic component includes a switching device comprising a source, a gate, and a drain, the switching device configured to have a predetermined device current switching rate. The electronic component also includes a gate driver coupled between the source and the gate of the switching device. The method includes causing the gate driver to switch an output voltage of the gate driver from a first state to a second state at a gate driver switching rate, whereby a gate voltage of the switching device is switched at substantially the same rate as the gate driver switching rate, and wherein switching of the output voltage of the gate driver from the first state to the second state causes current through the switching device to be switched at a current switching rate less than the predetermined device current switching rate.

In a fourth aspect, a circuit includes a switching device having a maximum rated current and comprising a source, a gate, and a drain. The circuit also includes a first voltage supply which applies an output voltage of at least 300 Volts, and a gate driver connected to a second voltage supply and coupled between the source and the gate of the switching device, the gate driver configured to switch a gate voltage of the switching device at a gate driver switching rate. The gate driver is configured such that in operation, an output current of the gate driver cannot exceed a first current level. Furthermore, the switching device is configured to block the output voltage applied by the first voltage supply during at least a portion of operation of the circuit, a ratio of the first current level to the maximum rated current of the switching device is less than $1/100$, and in operation of the circuit, a voltage switching rate of the switching device is greater than 100 Volts/nanosecond.

The electronic components, circuits, and methods described herein can include one or more of the following features. The electronic component can be part of a half bridge circuit. The switching device can comprise a III-Nitride transistor. The switching device can comprise an enhancement-mode transistor coupled to a depletion-mode transistor. The depletion-mode transistor and the enhancement-mode transistor can be configured such that a source of the enhancement-mode transistor serves as the source of the switching device, a gate of the enhancement-mode transistor serves as the gate of the switching device, and a drain of the depletion-mode transistor serves as a gate of the switching device. The switching device can be operable to block at least 300V when biased OFF. A maximum rated current of the switching device can be at least 50 Amps. A ratio of the first current level to a maximum rated current of the switching device can be less than 1/100. The switching rate of the switching device in operation can be less than 0.5 times the predetermined device switching rate. The output of the gate driver can be directly connected to the gate of the switching device. The electronic component or circuit can further include a ferrite bead connected between the output of the gate driver and the gate of the switching device.

An output of the gate driver can be electrically connected to the gate, and switching the output voltage of the gate driver from the first state to the second state can cause a voltage of at least 300V to be switched across the switching device. A maximum output current of the gate driver can be sufficiently small to cause the current switching rate of the switching device to be less than the predetermined device current switching rate. The circuit can be a half bridge. The half bridge can be connected to an inductive load, wherein in operation, a current greater than 1 Amp passes through the inductive load. The second voltage supply can apply an output voltage that is substantially less than the output voltage of the first voltage supply. The second voltage supply can apply an output voltage less than 25 Volts. An output of the gate driver can be electrically connected to the gate of the switching device. The circuit can further comprise a resistor between an output of the gate driver and the gate of the switching device, wherein the resistor has a resistance between 0 Ohms and 5 Ohms. The switching device can comprise a III-Nitride transistor.

The details of one or more embodiments of the subject matter described in this specification are set forth in the accompanying drawings and the description below. Other features, aspects, and advantages of the subject matter will become apparent from the description, the drawings, and the claims.

DESCRIPTION OF DRAWINGS

Like reference symbols in the various drawings indicate like elements.

DETAILED DESCRIPTION

Figure 1:
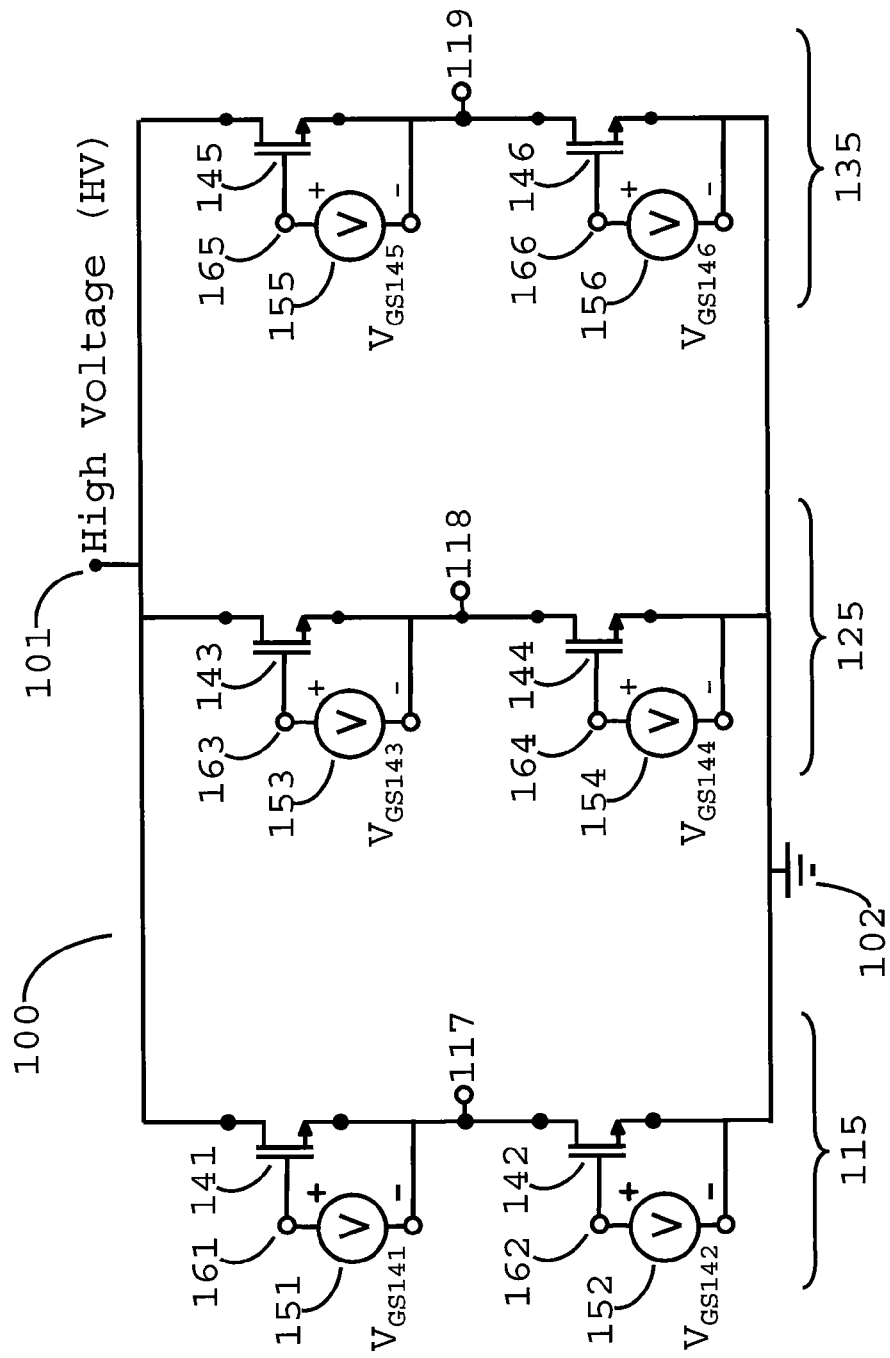
FIG. 1 illustrates a circuit schematic of a prior art 3-phase bridge circuit.
Figure 2:
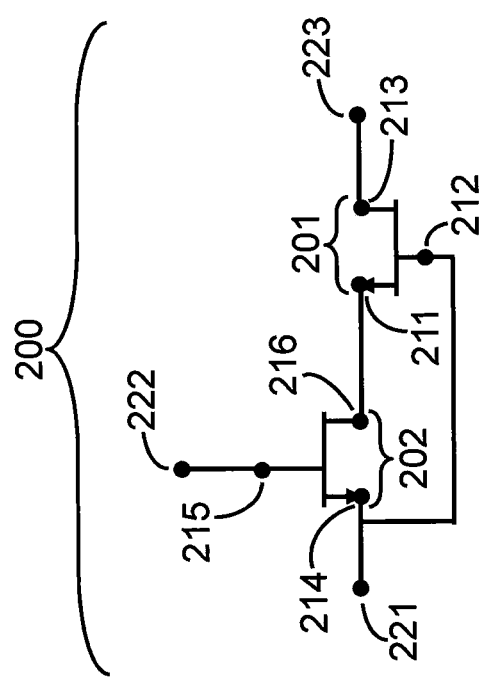
FIG. 2 is a prior art circuit schematic of two transistors arranged in a cascode configuration.
Figure 3A:
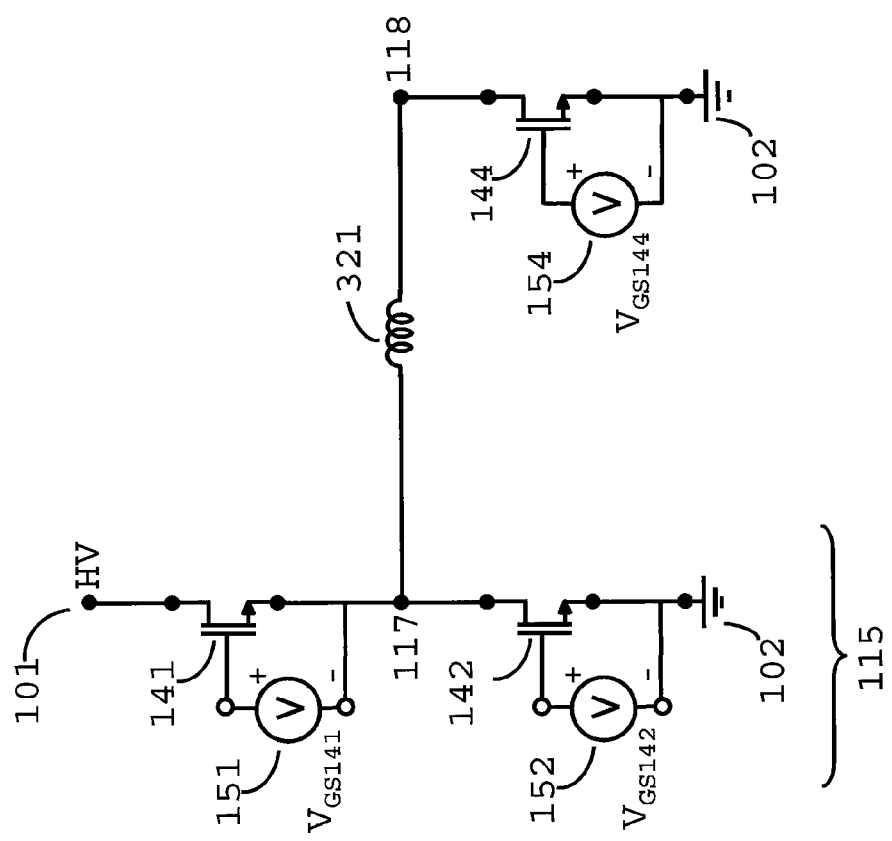
FIGS. 3A-3C illustrate portions of the prior art 3-phase bridge circuit of FIG. 1 under various operating conditions.
Figure 3B:
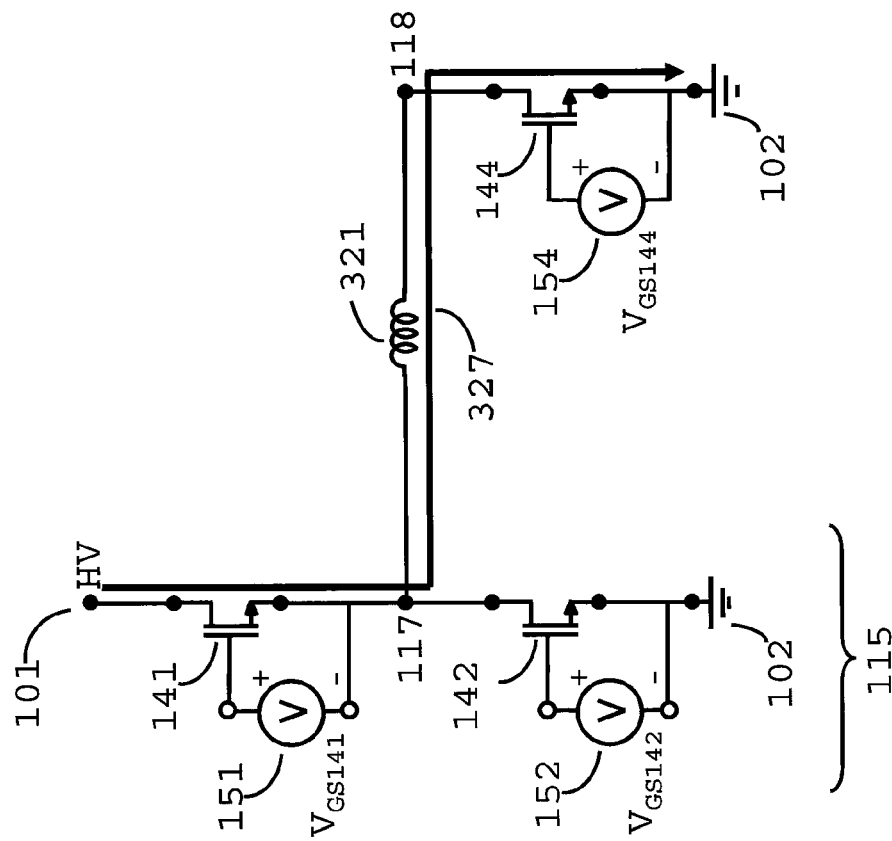
Figure 3C:
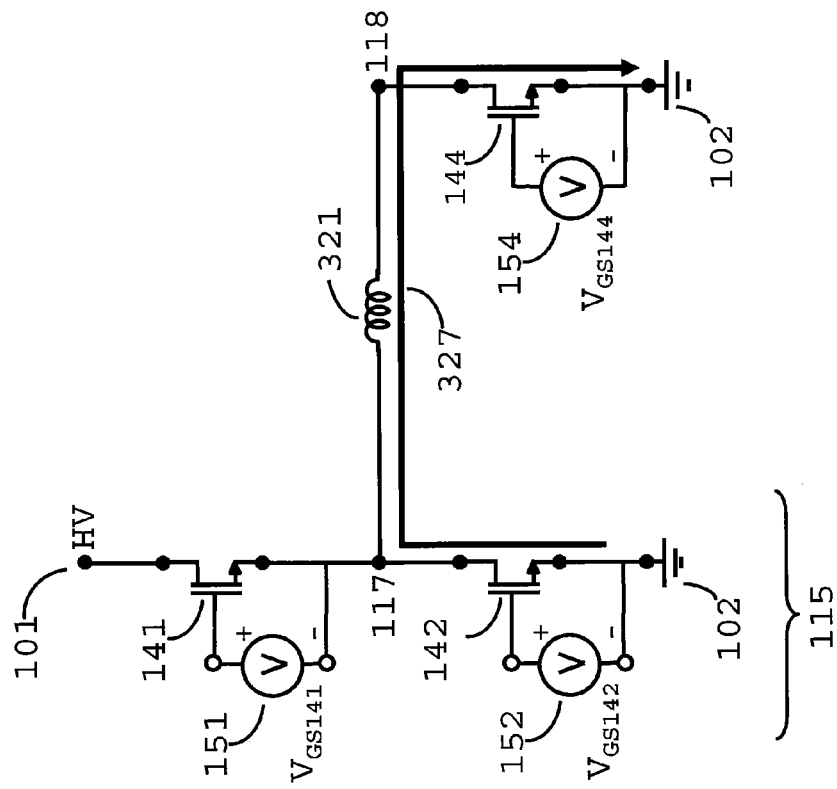

Described herein are configurations and methods for slowing the switching rate (i.e., the slew rate) of switching devices utilized in electronic components and circuits. This reduction in switching rate reduces levels of EMI in the circuits during and immediately following switching, thereby allowing for improved circuit stability, in particular in applications where high currents (e.g., 4 Amps or higher) and/or high voltages (e.g., greater than 300V) are being switched by the switching devices.

Each of the transistors or other switching devices in the circuits and components described herein can be configured to be hard-switched, as previously described, at a particular switching rate. When a transistor of one of the circuits herein is in the OFF state with no substantial current flowing through it, it supports a large voltage which can be about equal to or close to the circuit high voltage. When a transistor of one of the circuits herein is in the ON state, it typically has substantial current passing through it with only a small voltage across it. The switching time of a switching transistor switched under hard-switching conditions is defined as follows. When the transistor is switched from the OFF state described above to the ON state described above, the current through the device begins to increase at the onset of switching, while the voltage across the device remains approximately the same. The voltage across the device does not begin to drop substantially until the point at which substantially all the load current passes through the transistor. The time that elapses between the onset of switching and the point at which the voltage begins to drop is referred to as the "delay time" of the device. This is also the time that is required for the output of the device to begin to respond to a signal applied to the input. After the delay time is reached, the voltage across the transistor begins to drop. The time that elapses from the onset of this voltage drop to the point at which the voltage reaches its steady-state value is referred to as the "transition time" of the device. The time that elapses between the onset of switching and the point at which the voltage across the device drops to its steady-state value, which is the sum of the delay time and the transition time, is referred to as the "switching time" for turning the transistor on. The total current switched divided by the delay time, (dI/dt), is referred to as the "current switching rate". The total voltage switched across the device divided by the transition time, (dV/dt), is referred to as the "voltage switching rate". In general, while shorter switching times (and therefore faster switching rates) typically result in lower switching losses, they typically also cause higher levels of EMI, which can degrade circuit components or damage them such that they may be rendered inoperable. Reducing the current and/or voltage switching rates of the switching devices during circuit operation can mitigate these deleterious effects.

Figure 4:
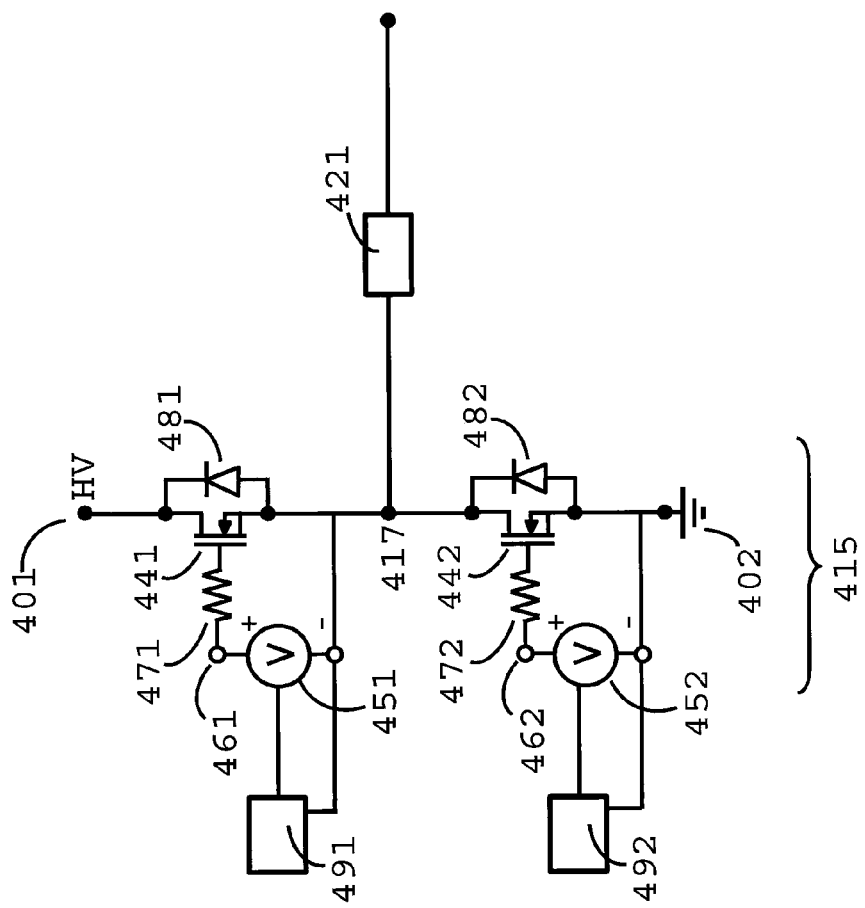
FIGS. 4-5 illustrate half bridge circuits configured to drive electrical loads.

An implementation of a power conversion circuit in which the switching rate of the switching devices is reduced is illustrated in FIG. 4. As seen in FIG. 4, half bridge 415 includes high side switching device 441 and low side switching device 442. Switching devices 441 and 442 are implemented as silicon-based power MOSFETs (metal-oxide-semiconductor field-effect transistors) or IGBTs (insulated gate bipolar transistors). Because MOSFETs and IGBTs have inherent low-performance anti-parallel diodes integrated into their device structures, external diodes 481 and 482 are connected anti-parallel to switches 441 and 442, respectively, in order to minimize losses during times where the switches carry reverse freewheeling currents. The output node 417 of the half bridge 415 is connected to a load 421.

The gates of switching devices 441 and 442 are switched by gate drivers 451 and 452, respectively. The voltages applied at the outputs of the gate drivers are provided by power supplies (e.g., voltage supplies) 491 and 492, which are connected to each of the gate drivers 451 and 452. Each gate driver is configured to apply this voltage at its output when the switching device is to be turned ON, and to remove this voltage (i.e., to apply 0 Volts) when the switching device is to be turned OFF. The voltages provided by voltage supplies 491 and 492 are typically much smaller than the circuit high voltage (HV) 401, which is provided by a different power supply. For example, in high voltage applications where the circuit high voltage 401 is greater than 300 Volts, voltage supplies 491 and 492 typically provide a voltage of about 25 Volts or less, for example about 12 Volts.

The switching time that elapses while gate drivers 451 and 452 switch the voltages at their respective outputs 461 and 462 can be much less than the minimum switching time of switching devices 441 and 442. As shown in FIG. 4, resistors 471 and 472 are inserted between the gates of switching devices 441 and 442, respectively, and the outputs 461 and 462 of their respective gate drivers 451 and 452. This causes the voltage at the gates of switching devices 441 and 442 to vary more slowly than at the outputs 461 and 462 of their respective gate drivers 451 and 452, thereby slowing the switching rate of each of switches 441 and 442 to a value lower than their maximum switching rates. In high voltage applications, for example applications in which the circuit high voltage (HV) 401 is at least 300V, because the gate charge of an IGBT or a MOSFET is large, a small resistor can be used for each of resistors 471 and 472 in order to achieve the desired reduction in switching rate. For example, in the case where switching devices 441 and 442 are rated to support a maximum current of 60 amps or larger and an OFF state voltage of at least 300V, resistors 471 and 472 can each have a resistance that is substantially less than 40 ohms but greater than 8 ohms, for example between 10 and 20 ohms. However, in these high voltage applications (i.e., where the circuit high voltage supply is greater than 300V), the switching devices 441 and 442, which are IGBTs/MOSFETs, become unstable if a gate resistor 471/472 is not included between the gate driver and the gate of the switching device, or if the gate resistor is too small (e.g., less than about 7-8 ohms).

During switching of devices 441 and 442, current flows through the outputs 461 and 462 of gate drivers 451 and 452 onto the gates of devices 441 and 442. In many cases, for MOSFET or IGBT switching devices, in order to maintain circuit stability, in addition to inclusion of resistors 471 and 472, the gate drivers must be capable of providing adequate output currents, the amount of current needed being proportional to the gate width, and hence to the current handling capabilities of the switching device (since the current handling capabilities are also proportional to the gate width). Thus, the maximum output current of the gate drivers must be kept above a minimum value, the minimum value being proportional to the current handling capabilities and the gate width of their respective switching devices. For example, for a MOSFET or IGBT with a maximum rated current of 60 Amps and an OFF state operating voltage of at least 300V, the gate driver must have a maximum output current of at least 1.4 Amps and resistors 471 and 472 have at least about 10 ohms of resistance in order to prevent instability in the circuit. More generally, the ratio of maximum output current of the gate driver to maximum rated current of the switching device must be at least 1.4/60, and is typically much higher. This condition typically must be maintained when a resistor is connected between the gate driver and the gate of the switching device in order to reduce the device switching rate, as in FIG. 4, and also when the resistor is omitted and the output of the gate driver is electrically connected directly to the gate of the switching device, as was shown in FIGS. 1 and 3A-3C. If this condition is not maintained, in particular in applications where the switching devices block at least 300V when they are biased in the OFF state, the circuit can become unstable during operation. Hence, in the half bridge circuit of FIG. 4, gate drivers 451 and 452 are both configured to supply maximum output currents that are at least 1.4/60 times the maximum rated currents of switches 441 and 442.

In some high voltage applications (i.e., half bridges where the high voltage is greater than 300V) in which the load currents are very high, for example 300 Amps or higher, the ratio of the maximum output current of the gate driver 451 or 452 to the maximum rated current of the IGBT or MOSFET switching device 441 or 442 may be less than 1/60. In these applications, if the outputs 461/462 of gate drivers 451/452, respectively, were connected directly to the gates of the IGBT/MOSFET switching devices, the half bridge 415 would be unstable and would not function properly. Hence, in applications that require such high currents, resistors 471 and 472 are required for proper operation of half bridge 415, and each of the resistors needs to have a resistance of at least about 10 ohms.

The maximum rated current of a transistor or other switching device is defined as follows. When the gate of the switching device is biased relative to the source at a voltage slightly higher than the device threshold voltage, the device is in the ON state, and current flows from the drain to the source when a small drain-source voltage (i.e., a drain-source voltage that is much smaller than the device breakdown voltage but greater than the device knee voltage) is applied. If the gate voltage is increased, the current increases up to a maximum value and then ceases to increase even if the gate voltage is further increased. This maximum value is larger if the current is only applied in short enough pulses (e.g., about 1 microsecond or less) that the device does not substantially heat up. This maximum value under short current pulse conditions is the maximum rated current of the switching device.

Figure 5:
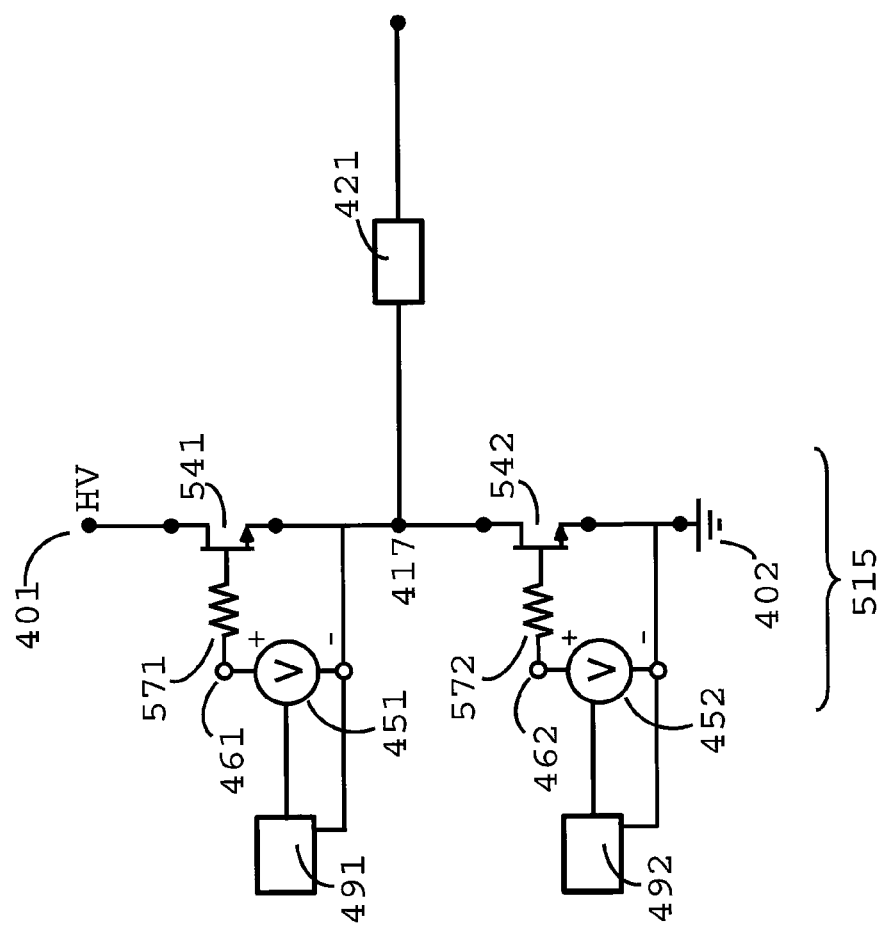

FIG. 5 illustrates another half bridge circuit 515 in which III-Nitride transistors 541 and 542, which for example can be III-Nitride high electron mobility transistors (HEMTs), are implemented as the high side and low side switch, respectively. III-Nitride transistors 541 and 542 have the same maximum current rating and voltage handling characteristics as devices 441 and 442 of FIG. 4. Because the III-Nitride transistors are capable of flowing reverse freewheeling currents through their channels, even when their gates are biased OFF relative to their sources, freewheeling diodes such as diodes 481 and 482 shown in FIG. 4 are not required, although they may optionally be included.

III-Nitride transistors are desirable for many of the applications in which high-voltage and/or high-current switching is required, due to their ability to incur minimal switching losses when they are hard-switched at high switching rates. However, because these devices inherently have very high predetermined switching rates (much higher than silicon-based MOSFETs and IGBTs), it is often desirable to reduce the switching rate during operation in order to minimize EMI and associated instabilities. As used herein, the terms III-Nitride or III-N materials, layers, devices, structures, etc., refer to a material, layer, device, or structure comprised of a compound semiconductor material according to the stoichiometric formula $B_wAl_xIn_yGa_zN$, where $w+x+y+z$ is about 1, $0 \le w \le 1$, $0 \le x \le 1$, $0 \le y \le 1$, and $0 \le z \le 1$. In a III-Nitride or III-N device, such as a transistor or HEMT, the conductive channel can be partially or entirely contained within a III-N material layer.

Figure 6:
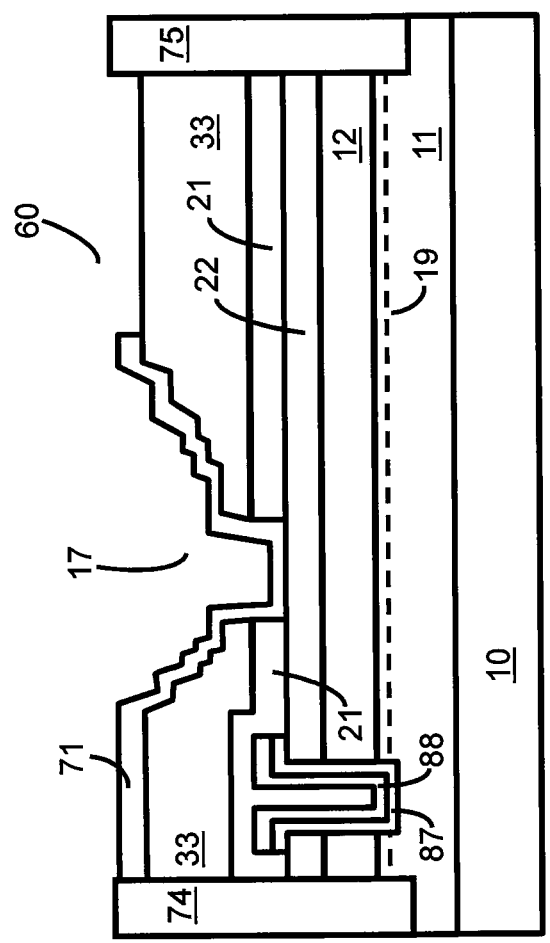
FIG. 6 is a cross-sectional schematic view of a III-Nitride enhancement-mode transistor.

An example of a III-N HEMT device 60 that can be implemented for switching devices 541 and 542 of FIG. 5 is shown in FIG. 6. Referring to FIG. 6, device 60 is an enhancement-mode III-Nitride transistor. Device 60 includes a substrate 10 (although the substrate is optional), which can for example be silicon, and a III-Nitride material structure on the substrate, the III-Nitride material structure including a III-N channel layer 11, which can for example be GaN, and a III-N barrier layer 12, which can for example be AlGaN. A two-dimensional electron gas (2DEG) channel 19 is induced in the III-N channel layer 11 adjacent to the III-N barrier layer 12 due to a compositional difference between the III-N channel and barrier layers. Source contact 74 and drain contact 75 are on opposite sides of gate 88 and electrically contact the 2DEG channel 19. Gate 88 is formed over a gate insulator layer 87, and both layers 87 and 88 are in a recess that extends into the III-Nitride material structure. An insulating material structure which includes an insulating layer 22, an etch stop layer 21, and an electrode defining layer 33 is formed over the III-N material structure, and a recess 17 is formed in the insulating material structure. A source-connected field plate 71 extends from the source towards the gate, and a portion of field plate 71 is in the recess 17.

As seen in FIG. 6, device 60 is a lateral device. That is, the transistor channel is contained within a semiconductor layer 11 of the transistor 60, and the source, gate, and drain electrodes 74, 88, and 75, respectively, are on the same side of the semiconductor layer 11, as shown. Specifically, the portions of the source and drain electrodes 74 and 75 that form an ohmic contact to the channel in layer 11, as well as the portion of the gate electrode 88 that modulates the current in the channel, are each on the same side of the semiconductor layer 11.

Referring back to FIG. 5, the output node 417 of the half bridge 515 is connected to a load 421. Half bridge 515 also uses the same gate drivers 451 and 452 and corresponding voltage supplies 491 and 492 as those used in the circuit of FIG. 4 to drive the gates of transistors 541 and 542. Resistors 571 and 572 are inserted between the gates of switching devices 541 and 542, respectively, and the outputs 461 and 462 of their respective gate drivers 451 and 452, in order to reduce the switching rate of each of switches 541 and 542 to a value lower than their maximum switching rates. However, because the gate charge of a III-Nitride transistor, and in particular a lateral III-Nitride transistor, is much less than that of an IGBT or MOSFET of the same maximum current rating and voltage handling characteristics, resistors 571 and 572 need to be made substantially larger than resistors 471 and 472 of FIG. 4 in order to sufficiently reduce the switching rate of transistors 541 and 542. For example, in the case where switching devices 541 and 542 are rated to support a maximum current of 60 amps and an OFF state voltage of at least 300V, resistors 471 and 472 can each have a resistance that is at least 50 ohms in order to effectively reduce the switching rate of transistors 541 and 542. However, current noise (from thermal currents and/or other noise sources) $I_{noise}$ that passes through resistors 571 and 572 creates voltage noise (e.g., voltage fluctuations) $V_{noise}$ at the gates of transistors 541 and 542. These voltage fluctuations $V_{noise}$ are given by the equation $V_{noise}=I_{noise}*R$, where R is the resistance of resistors 571 and 572. Hence if R is made large, as is required in the circuit of FIG. 5 to effectively reduce the switching rate of transistors 541 and 542 during operation, $V_{noise}$ becomes large, which results in the circuit being unstable. Hence in some applications, when devices with low gate charge, such as III-Nitride transistors, are used as high-current/high-voltage switches, the switching rate of the switches cannot be reduced by adding a resistor between the transistor and the gate driver without making the circuit unstable.

Figure 7:
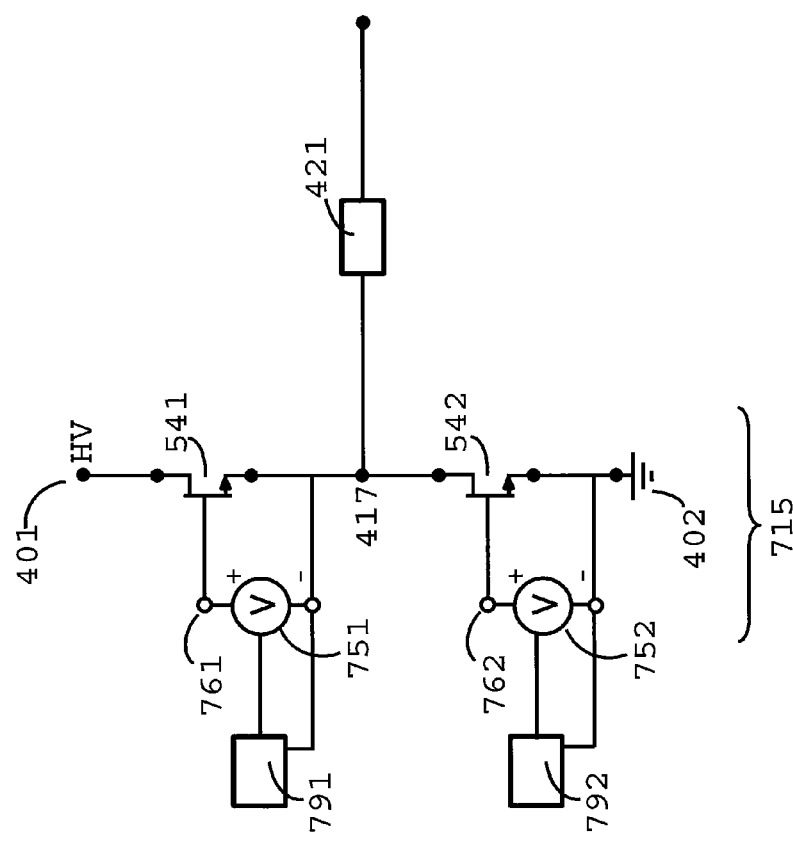
FIGS. 7-8 illustrate half bridge circuits configured to drive electrical loads.

FIG. 7 illustrates a half bridge circuit 715 which is similar to half bridge circuit 515 of FIG. 5, and uses the same switching transistors 541 and 542, but resistors 571 and 572 have been omitted. Furthermore, gate drivers 451 and 452 and corresponding power supplies 491 and 492 of circuit 515 of FIG. 5 have been replaced by gate drivers 751 and 752 and corresponding power supplies 791 and 792, which have specific properties that cause the current and/or voltage switching rates of transistors 541 and 542 to be reduced without the need for an intermediary gate resistor, as described in more detail below. The outputs 761 and 762 of gate drivers 751 and 752, respectively, are electrically connected (i.e., directly connected) to the gates of switching devices 541 and 542.

The voltage supplies 791 and 792 that are connected to gate drivers 751 and 752, respectively, have similar voltage output characteristics to voltage supplies 491 and 492 of FIGS. 4-5. However, gate drivers 751 and 752 of half bridge circuit 715 are configured to have a much lower limit on their maximum rated output currents (i.e., the maximum output current that they are able to supply or sink during operation), as compared to the gate drivers 451 and 452 of half bridges 415 (in FIG. 4) and 515 (in FIG. 5). Specifically, the circuitry of the gate driver can be configured to limit the output current of the gate driver such that it cannot exceed a predetermined value during operation. It has been found that for high voltage switching devices that inherently exhibit very low minimum switching times (and therefore high maximum switching rates) and in which the gate charge is low (which is the case with III-Nitride switching transistors), using a gate driver with a low maximum rated output current reduces the current switching rate of the transistor during operation (and in some cases also the voltage switching rate) without the need for a resistor between its gate and the output node of the gate driver. Furthermore, such a configuration has been found to substantially improve circuit stability. Alternatively, although not shown in FIG. 7, a small resistor, having a resistance between 0 and 5 Ohms, could be included between the outputs of the gate drivers and the gates of the transistors, and the resulting circuit would still exhibit the advantages described above. In another alternative configuration, also not shown in FIG. 7, a ferrite bead is included between the outputs of one or more of the gate drivers and the gates of their associated transistors.

As an example, for a half bridge 715 of FIG. 7 utilizing III-Nitride transistors 541 and 542 configured to block at least 300V in the OFF state and rated to support a maximum current of 60 Amps in the ON state, in the case where the resistance between the output of the outputs of the gate drivers and the gates of their associated transistors is 0 Ohms or between 0 and 5 Ohms, employing gate drivers 751 and 752 with maximum output currents of less than 1 Amp, for example about 0.5 Amps or less, causes a substantial reduction in the current switching rate of the III-Nitride transistors during operation, hence increasing the switching time, and at the same time improves the stability of the circuit. In general, employing gate drivers for which the ratio of the maximum output current of the gate driver to the maximum rated current of the III-Nitride transistors is less than 1/60, for example less than 1/100, or less than 1/150, reduces the switching rate of the III-Nitride transistors during operation while at the same time improving the stability of the circuit. These advantages are realized both when the outputs of the gate drivers are directly connected to the gates of their associated transistors, and when a small resistor having a resistance between 0 and 5 Ohms is inserted between the outputs of the gate drivers and the gates of their associated transistors. These advantages are also realized when a ferrite bead is inserted between the outputs of one or more of the gate drivers and the gates of their associated transistors.

The above results were unexpected for several reasons. First, it was not obvious that utilizing a gate driver with a reduced maximum output current would reduce the switching rate of the III-Nitride transistors during operation. Second, it was not expected that such a configuration would substantially improve the stability of the circuit, in particular because when such a low output current gate driver configuration is employed using different switching devices, such as silicon MOSFETs and IGBTs, in the same applications, in particular without a sufficiently large gate resistor (e.g., 10 Ohms or larger), the circuits in fact become unstable.

Figure 8:
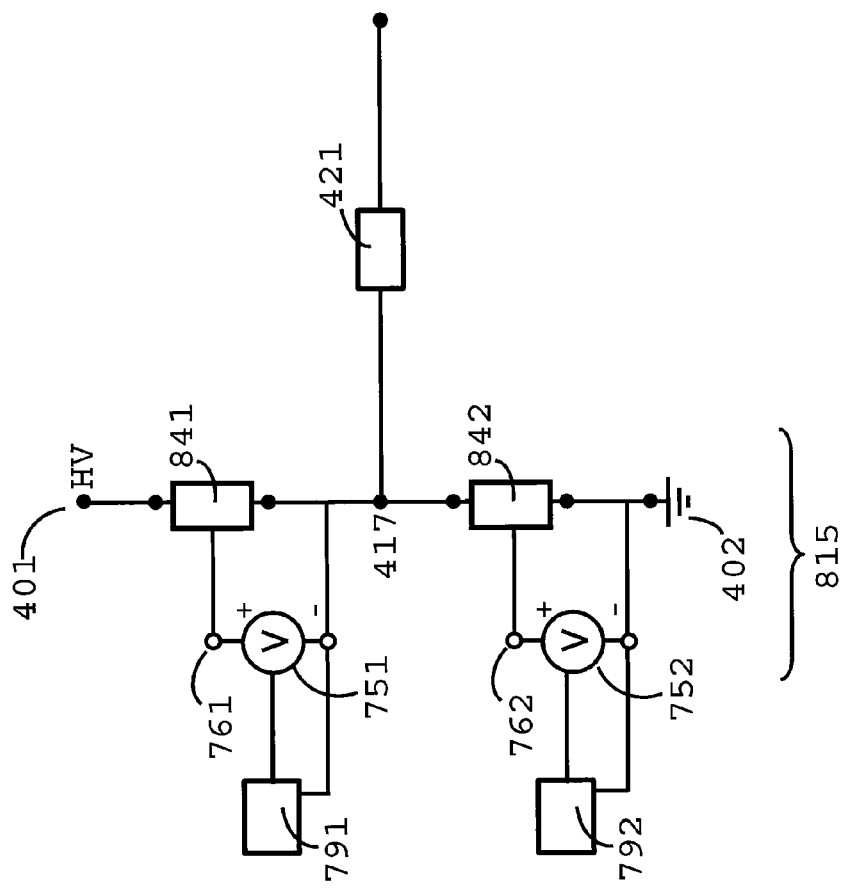

While in FIG. 7, switching devices 541 and 542 are each shown to be a single transistor, other devices could be used, provided that they have characteristics that allow their switching rates to be reduced by employing a gate driver with a low maximum current, and they do not become unstable or cause the circuit to become unstable when such a configuration is implemented. For example, a high-voltage hybrid enhancement-mode device 900, shown in FIG. 9, could be used in place of each of transistors 541 and 542 in the half bridge 715 of FIG. 7. Such a configuration is shown in FIG. 8, which illustrates another half bridge 815 that is the same as half bridge 715 of FIG. 7, except that the high-side and low-side switches 841 and 842, respectively, are each implemented as a high-voltage hybrid enhancement-mode device 900, shown in FIG. 9.

As used herein, a "high-voltage switching device", such as a high-voltage switching transistor, is an electronic device which is optimized for high-voltage switching applications. That is, when the transistor is off, it is capable of blocking high voltages, such as about 300V or higher, about 600V or higher, about 1200V or higher, or about 1700V or higher, and when the transistor is on, it has a sufficiently low on-resistance ($R_{ON}$) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, or other suitable blocking voltage required by the application. In other words, a high-voltage device can block any voltage between 0V and at least $V_{max}$, where $V_{max}$ is the maximum voltage that could be supplied by the circuit or power supply. In some implementations, a high-voltage device can block any voltage between 0V and at least $2*V_{max}$. As used herein, a "low-voltage device", such as a low-voltage transistor, is an electronic device which is capable of blocking low voltages, such as between 0V and $V_{low}$ (where $V_{low}$ is less than $V_{max}$), but is not capable of blocking voltages higher than $V_{low}$. In some implementations, $V_{low}$ is equal to about $|V_{th}|$, greater than $|V_{th}|$, about $2*|V_{th}|$, about $3*|V_{th}|$, or between about $|V_{th}|$ and $3*|V_{th}|$, where $|V_{th}|$ is the absolute value of the threshold voltage of a high-voltage transistor, such as a high-voltage-depletion mode transistor, contained within a hybrid component, such as that illustrated in FIGS. 7a and 7b and described in further detail below. In other implementations, $V_{low}$ is about 10V, about 20V, about 30V, about 40V, or between about 5V and 50V, such as between about 10V and 40V. In yet other implementations, $V_{low}$ is less than about $0.5*V_{max}$, less than about $0.3*V_{max}$, less than about $0.1*V_{max}$, less than about $0.05*V_{max}$, or less than about $0.02*V_{max}$.

Figure 9:
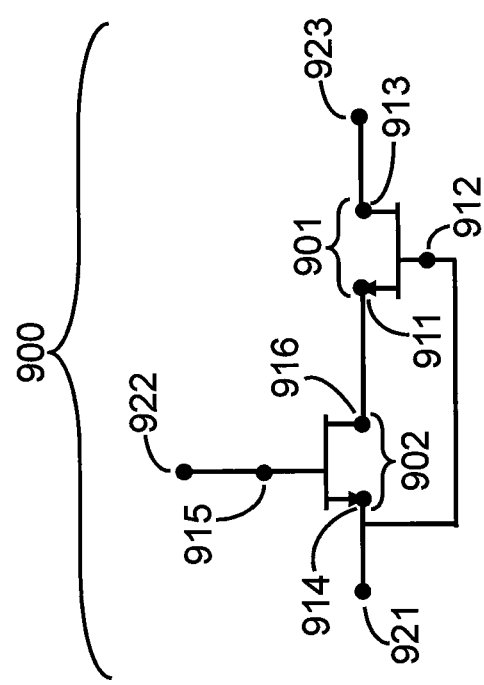
FIG. 9 is a circuit schematic of a cascode device that can be used as a switching device in the half bridge circuit of FIG. 8.

Referring to FIG. 9, since high-voltage III-N enhancement-mode transistors can be difficult to fabricate reliably, one alternative to a single high-voltage III-N E-mode transistor is to combine a high-voltage III-N D-mode transistor 901 with a low-voltage E-mode transistor 902 in the configuration of FIG. 9 to form a hybrid device 900. Hybrid device 900 can be operated in the same way as a single high-voltage E-mode transistor, and in many cases achieves the same or similar output characteristics as a single high-voltage E-mode transistor. Hybrid device 900 includes a high-voltage III-N D-mode transistor 901 and a low-voltage E-mode transistor 902, which can for example be a low-voltage silicon power MOSFET. E-mode transistor 902 can be a vertical transistor, having its drain electrode 916 on the opposite side of the device semiconductor layers from its source electrode 914 and gate electrode 915, and D-mode III-N transistor 901 can be a lateral transistor, having its source electrode 911, gate electrode 912, and drain electrode 913 all on the same side of the device III-N layers. However, other configurations for each of transistors 901 and 902 are possible as well.

Figure 10:
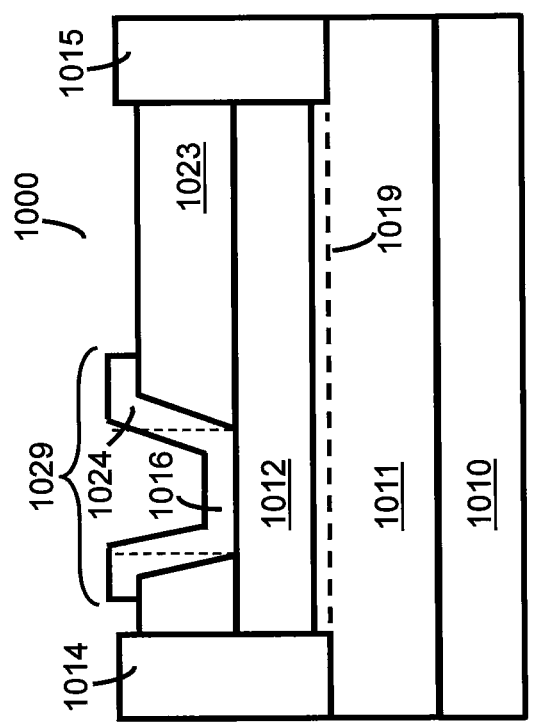
FIG. 10 is a cross-sectional schematic view of a III-Nitride depletion-mode transistor.

FIG. 10 illustrates an example III-N D-mode transistor 1000 that could be used for transistor 901 in FIG. 9. Transistor 1000 includes a substrate 1010 (although the substrate is optional), which can for example be silicon, and a III-Nitride material structure on the substrate, the III-Nitride material structure including a III-N channel layer 1011, which can for example be GaN, and a III-N barrier layer 1012, which can for example be AlGaN. A two-dimensional electron gas (2DEG) channel 1019 is induced in the III-N channel layer 1011 adjacent to the III-N barrier layer 1012 due to a compositional difference between the III-N channel and barrier layers. Source contact 1014 and drain contact 1015 are on opposite sides of electrode 1029 and electrically contact the 2DEG channel 19. Electrode 1029 includes the device gate 1016, as well as a field plate portion 1024 which extends from the gate 1016 towards the drain contact 1015. Electrode-defining layer 1023 is formed of an insulating material. A gate dielectric (not shown) may optionally be included between the gate 1016 and the underlying III-N material layers.

As seen in FIG. 10, transistor 1000 is a lateral device. That is, the transistor channel is contained within a semiconductor layer 1011 of the transistor 1000, and the source, gate, and drain electrodes 1014, 1016, and 1015, respectively, are on the same side of the semiconductor layer 1011. Specifically, the portions of the source and drain electrodes 1014 and 1015 that form an ohmic contact to the channel in layer 1011, as well as the portion of the gate 1016 that modulates the current in the channel, are each on the same side of the semiconductor layer 1011.

Referring back to FIG. 9, the source electrode 914 of the low-voltage E-mode transistor 902 and the gate electrode 912 of the high-voltage D-mode transistor 901 are electrically connected together, for example with wire bonds or other metal interconnections if they are integrated into a single structure, and together form the source 921 of the hybrid device 900. The gate electrode 915 of the low-voltage E-mode transistor 902 functions as the gate 922 of the hybrid device 900. The drain electrode 913 of the high-voltage D-mode transistor 901 functions as the drain 923 of the hybrid device 900. The source electrode 911 of the high-voltage D-mode transistor 901 is electrically connected to the drain electrode 916 of the low-voltage E-mode transistor 902.

As used herein, a "hybrid enhancement-mode electronic device or component", or simply a "hybrid device or component", is an electronic device or component formed of a depletion-mode transistor and a enhancement-mode transistor, where the depletion-mode transistor is capable of a higher operating and/or breakdown voltage as compared to the enhancement-mode transistor, and the hybrid device or component is configured to operate similarly to a single enhancement-mode transistor with a breakdown and/or operating voltage about as high as that of the depletion-mode transistor. That is, a hybrid enhancement-mode device or component includes at least 3 nodes having the following properties. When the first node (source node) and second node (gate node) are held at the same voltage, the hybrid enhancement-mode device or component can block a positive high voltage (i.e., a voltage larger than the maximum voltage that the enhancement-mode transistor is capable of blocking) applied to the third node (drain node) relative to the source node. When the gate node is held at a sufficiently positive voltage (i.e., greater than the threshold voltage of the enhancement-mode transistor) relative to the source node, current passes from the source node to the drain node or from the drain node to the source node when a sufficiently positive voltage is applied to the drain node relative to the source node. When the enhancement-mode transistor is a low-voltage device and the depletion-mode transistor is a high-voltage device, the hybrid component can operate similarly to a single high-voltage enhancement-mode transistor. The depletion-mode transistor can have a breakdown and/or maximum operating voltage that is at least two times, at least three times, at least five times, at least ten times, or at least twenty times that of the enhancement-mode transistor.

It has been found that when a hybrid device such as device 900 shown in FIG. 9 is used for switching devices 841 and 842 in half bridge 815 of FIG. 8, utilizing gate drivers 751 and 752 with low maximum output currents provides the same reduction in switching speed and improvements in circuit stability that were previously described for half bridge 715 of FIG. 7. Specifically, for a half bridge 815 utilizing hybrid device 900 of FIG. 9 for switches 841 and 842, where each of the switches is configured to block at least 300V in the OFF state and rated to support a maximum current of 60 Amps in the ON state, employing gate drivers 751 and 752 with maximum rated output currents of less than 1 Amp, for example about 0.5 Amps or less, causes a substantial reduction in the current switching rate of the hybrid devices during operation, and at the same time improves the stability of the circuit. This effect was also observed to occur when a small resistor (having a resistance between 0 and 5 Ohms) or a ferrite bead was inserted between the outputs of one or more of the gate drivers and the gates of their associated transistors. This result was unexpected for the same reasons provided above with reference to half bridge 715 of FIG. 7. Furthermore, gate drivers with even lower output currents may additionally reduce the voltage switching rate of the hybrid devices during operation, thereby providing added stability.

As described above, for half bridge 815 of FIG. 8, employing gate drivers 751 and 752 with maximum output currents of less than 1 Amp causes a substantial reduction in the current switching rate of the hybrid devices during operation and at the same time improves the stability of the circuit. However, even when a gate driver with a maximum rated current level as low as 0.5 Amps is used, the voltage switching rate remains greater than 100 Volts/nanosecond. High voltage switching rates are desirable in many applications because they can reduce switching losses during operation. However, stable operation with such high device voltage switching rates typically cannot be achieved in conventional half bridge circuits. Hence, use of gate drivers 751 and 752, in which the maximum current level that the gate driver is capable of providing at its output is less than 1/100 times the maximum rated current of the switching devices 841 and 842, allows for stable operation of the circuit, even with device voltage switching rates greater than 100 Volts/nanosecond. This result is unexpected for the same reasons previously provided.

Figure 13:
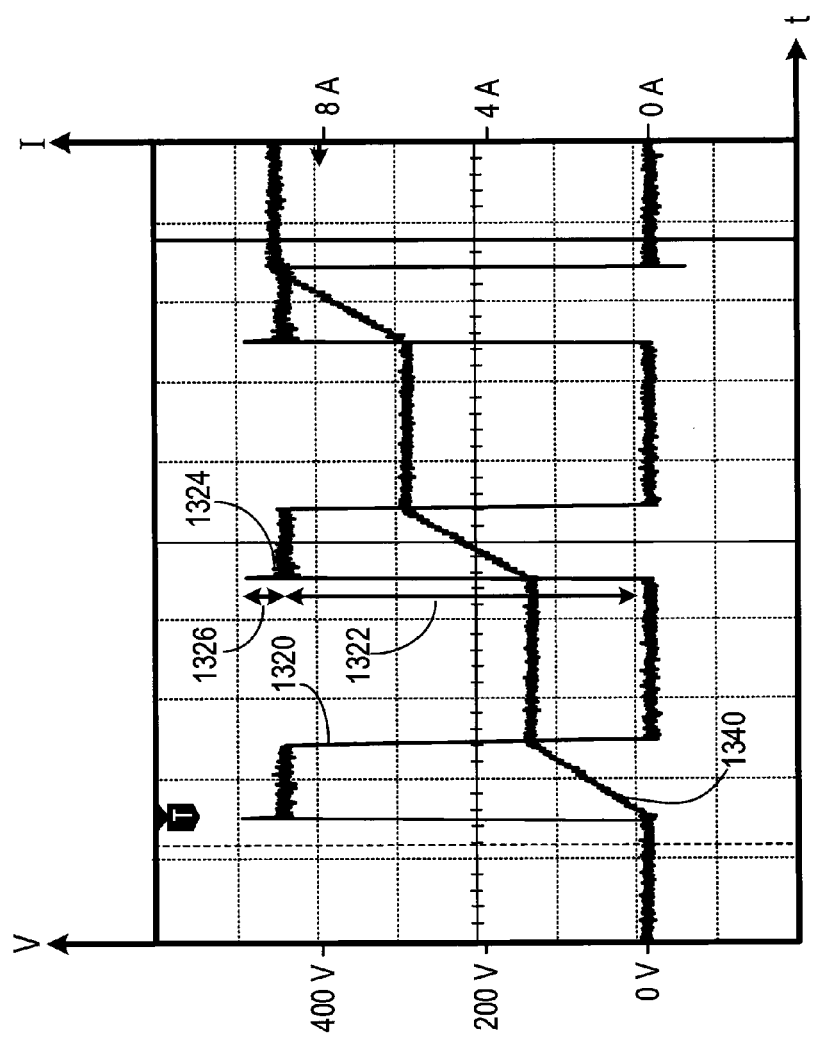
FIG. 13 is a plot of voltage and current characteristics as a function of time for a switching device of the half bridge circuit of FIG. 8 during circuit operation.

FIG. 13 is a plot of the current and voltage characteristics of high side switching device 841 of FIG. 8 during a switching sequence in the case where the circuit high voltage 401 was maintained at 450 Volts, such that a voltage greater than 400 Volts, and substantially greater than 300 Volts, was switched across switching device 841. Gate drivers 751 and 752 were each configured such that the maximum current they were able to provide through their respective outputs was 0.5 Amps. Low side switching device 842 was kept OFF, while high side switching device 841 was switched, such that the mode of operation (in terms of the path that the current flowed) was similar to that shown for half bridge 115 in FIGS. 3B-3C. Switching devices 841 and 842 each had a maximum rated current level of 60 Amps, and were configured to be capable of blocking 600V. Curve 1320 is a plot of the voltage at node 417 as a function of time, and curve 1340 is a plot of the current passing through the load 421 as a function of time. The axis on the left hand side of the plot corresponds to curve 1320, and the axis on the right hand side of the curve corresponds to curve 1340. The voltage switching rate of switching device 841 during operation was greater than 100 Volts/nanosecond. The voltage switched across the device 841 is indicated by arrow 1322.

As seen in FIG. 13, immediately after switching device 841 is switched ON or OFF, the voltage across the device oscillates but eventually stabilizes. For example, voltage oscillations 1324 occur after the second time during the switching sequence that switching device 841 is switched ON. The voltage overshoot above the desired voltage level that results from oscillations 1324 is indicated by arrow 1326. As seen, during each switching cycle when the switching device 841 is switched ON, the voltage overshoot remains less than 20% of the circuit high voltage (i.e., the approximate voltage switched across the switching device), even when the current switched through the switching device 841 is greater than 2 Amps. That is, the maximum voltage across switching device 841 was at all times less than 1.3 times and also less than 1.2 times the circuit high voltage during operation of the half bridge. Because the voltage across switching device 841 at all times remained less than 1.5 times the circuit high voltage, the voltage blocking capabilities of the switching devices 841 and 842 did not need to be overspecified as highly as would be required in typical high voltage circuits, allowing for a wider range of operating voltages for the half bridge circuit. Similar low-noise operation was also obtained when the high side switching device 841 was continuously biased OFF and the low side switching device 842 was switched. Such a low voltage overshoot at such high switching rates resulted from the use of gate drivers 751 and 752 with low maximum output current levels. For comparison, when the gate drivers 751 and 752 were replaced with gate drivers for which the output current was limited to 4 Amps and the same switching sequence shown in FIG. 13 was applied, the voltage overshoots were so large that the switching devices broke down and the circuit was rendered inoperable before the completion of a single switching sequence.

In typical power switching applications in which high-voltage switching devices are used, the device is, during the majority of time, in one of two states. In the first state, which is commonly referred to as the "on state", the voltage at the gate electrode relative to the source electrode is higher than the device threshold voltage, and substantial current flows through the device. In this state, the voltage difference between the source and drain is typically low, usually no more than a few volts, such as about 0.1-5 volts. In the second state, which is commonly referred to as the "off state", the voltage at the gate electrode relative to the source electrode is lower than the device threshold voltage, and no substantial current, apart from off-state leakage current, flows through the device. In this second state, the voltage between the source and drain can range anywhere from about 0V to the value of the circuit high voltage supply, which in some cases can be as high as 100V, 300V, 600V, 1200V, 1700V, or higher, but can be less than the breakdown voltage of the device. In some applications, inductive elements in the circuit cause the voltage between the source and drain to be even higher than the circuit high voltage supply. Additionally, there are short times immediately after the gate has been switched on or off during which the device is in a transition mode between the two states described above. When the device is in the off state, it is said to be "blocking a voltage" between the source and drain. As used herein, "blocking a voltage" refers to the ability of a transistor, device, or component to prevent significant current, such as current that is greater than 0.001 times the average operating current during regular on-state conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the average operating current during regular on-state conduction.

While the configurations and methods for reducing switching rates of transistors while improving circuit stability were described here with reference to bridge circuits and half bridges, the same methods and configurations can be used to achieve the same results in other circuits, for example power factor correction (PFC) circuits or AC-AC conversion circuits such as matrix converters. Additionally, in some applications, other types of switching devices may be utilized. For example, in an AC-AC converter, the switching devices can each be bidirectional switches, such as a III-N bidirectional switch 1100 (shown in FIG. 11) or a hybrid III-N bidirectional switch 1200 (as shown in FIG. 12).

Figure 11:
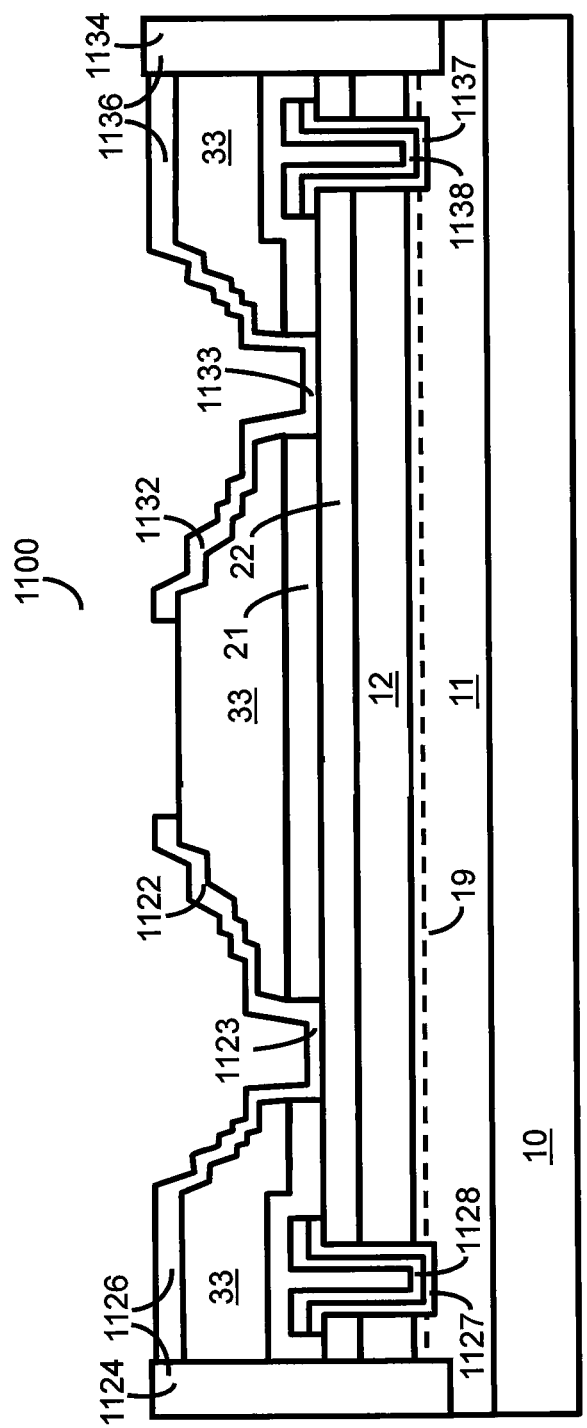
FIGS. 11 and 12 are illustrations of bidirectional switches.

As seen in FIG. 11, III-N bidirectional switch 1100 includes substrate 10, as well as III-N layers 11 and 12, in which the device 2DEG channel 19 is contained. Switch 1100 also includes power electrodes 1124 and 1134, which contact the channel 19 and both function as device sources and drains, depending on the direction of current flow or on the voltage polarity across the device. Gates 1128 and 1138 are between power electrodes 1124 and 1134, and are configured similarly to gate 88 of the enhancement-mode transistor 60 shown in FIG. 6. Although not shown in FIG. 11, device 1100 is configured to be operated with two gate drivers. A first gate driver is connected between gate 1128 and power electrode 1124, and a second gate driver is connected between gate 1138 and power electrode 1134. Each gate driver can be similar to or the same as gate drivers 791 and 792 of FIGS. 7 and 8. That is, in order to reduce the switching rate of switch 1100 and provide for stable operation of the circuit in which switch 1100 is used, the maximum current that each gate driver is capable of providing can be less than $\frac{1}{100}$ times the maximum rated current of the bidirectional switch 1100.

Figure 12:
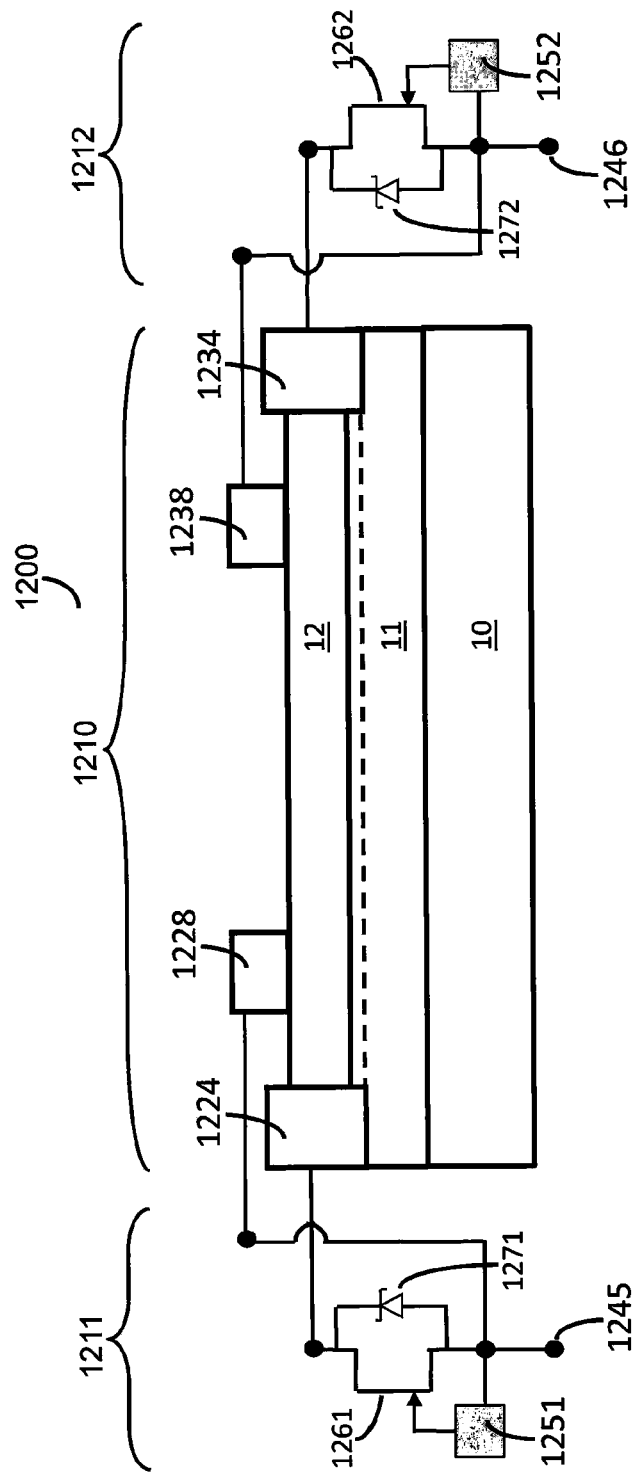

Referring to FIG. 12, bidirectional switch 1200 includes a high voltage depletion-mode III-N bidirectional switch 1210 connected in a cascode configuration to low voltage enhancement-mode transistors 1261 and 1262 to form a high voltage enhancement-mode bidirectional switch 1200. Power electrode 1224 of the III-N bidirectional switch 1210 is connected to the drain of transistor 1261. Power electrode 1234 of the III-N bidirectional switch 1210 is connected to the drain of transistor 1262. Gate electrode 1228 of the III-N bidirectional switch 1210 is connected to the source of transistor 1261. Gate electrode 1238 of the III-N bidirectional switch 1210 is connected to the source of transistor 1262. Anti-parallel diodes 1271 and 1272 are optionally provided across transistors 1261 and 1262, respectively. Gate driver 1251 is coupled between the gate and source of transistor 1261. Gate driver 1252 is coupled between the gate and source of transistor 1262. Each gate driver 1251 and 1252 can be similar to or the same as gate drivers 791 and 792 of FIGS. 7 and 8. That is, in order to reduce the switching rate of switch 1200 and provide for stable operation of the circuit in which switch 1200 is used, the maximum current that each gate driver is capable of providing can be less than $\frac{1}{100}$ times the maximum rated current of the bidirectional switch 1200.

A number of implementations have been described. Nevertheless, it will be understood that various modifications may be made without departing from the spirit and scope of the techniques and devices described herein. For example, in the circuits of FIGS. 7 and 8, a small resistor (with resistance between 0 and 5 Ohms) could be inserted between each gate driver and the gate of its corresponding switching device. In high voltage applications, when MOSFETs or IGBTs are used for the switching devices (as in FIG. 4), providing such small resistors at the gates of the switching devices does not provide sufficient stability to the circuit. In the circuit of FIG. 4, resistors 471 and 472 are larger resistors (i.e., have a larger resistance). Accordingly, other implementations are within the scope of the following claims.

What is claimed is:

1. An electronic component, comprising:
a switching device comprising a source, a gate, and a drain, the switching device having a predetermined device switching rate;
a gate driver electrically coupled between the source and the gate of the switching device; and
a ferrite bead connected between the output of the gate driver and the gate of the switching device, the gate driver configured to switch a gate voltage of the switching device at a gate driver switching rate, the gate driver configured such that in operation, an output current of the gate driver cannot exceed a first current level; wherein
the first current level is sufficiently small to provide a switching rate of the switching device in operation to be less than the predetermined device switching rate.

2. The electronic component of claim 1, wherein the electronic component is part of a half bridge circuit.

3. The electronic component of claim 1, wherein the switching device comprises a III-Nitride transistor.

4. The electronic component of claim 1, the switching device comprises an enhancement-mode transistor coupled to a depletion-mode transistor.

5. The electronic component of claim 4, wherein the depletion-mode transistor and the enhancement-mode transistor are configured such that a source of the enhancement-mode transistor serves as the source of the switching device, a gate of the enhancement-mode transistor serves as the gate of the switching device, and a drain of the depletion-mode transistor serves as a gate of the switching device.

6. The electronic component of claim 1, wherein the switching device is operable to block at least 300V when biased OFF.

7. The electronic component of claim 6, wherein a maximum rated current of the switching device is at least 50 Amps.

8. The electronic component of claim 6, wherein a ratio of the first current level to a maximum rated current of the switching device is less than 1/100.

9. The electronic component of claim 1, wherein the switching rate of the switching device in operation is less than 0.5 times the predetermined device switching rate.

10. An electronic component, comprising:
a switching device comprising a source, a gate, and a drain, the switching device being operable to block at least 300V when biased OFF;
a gate driver coupled between the source and the gate of the switching device; and
a ferrite bead connected between the output of the gate driver and the gate of the switching device; wherein
the gate driver is configured to switch voltage at an output of the gate driver at a gate driver switching rate, a resistance between the output of the gate driver and the gate of the switching device is less than 5 Ohms, and the gate driver is configured such that in operation, an output current of the gate driver is limited by circuitry of the gate driver such that the output current cannot exceed a first current level; and
a ratio of the first current level to a maximum rated current of the switching device is less than 1/100.

11. The electronic component of claim 10, wherein the switching device comprises a III-Nitride transistor.

12. The electronic component of claim 10, wherein the electronic component is part of a half bridge circuit.

13. The electronic component of claim 10, wherein the output of the gate driver is directly connected to the gate of the switching device.

14. A method of operating an electronic component, the electronic component comprising:
a switching device comprising a source, a gate, and a drain, the switching device configured to have a predetermined device current switching rate;
a gate driver coupled between the source and the gate of the switching device; and
a ferrite bead connected between the output of the gate driver and the gate of the switching device, the method comprising:
causing the gate driver to switch an output voltage of the gate driver from a first state to a second state at a gate driver switching rate, whereby a gate voltage of the switching device is switched at substantially the same rate as the gate driver switching rate; wherein
switching of the output voltage of the gate driver from the first state to the second state causes current through the switching device to be switched at a current switching rate less than the predetermined device current switching rate.

15. The method of claim 14, wherein an output of the gate driver is electrically connected to the gate, and switching the output voltage of the gate driver from the first state to the second state causes a voltage of at least 300V to be switched across the switching device.

16. The method of claim 14, wherein a maximum output current of the gate driver is sufficiently small to cause the current switching rate of the switching device to be less than the predetermined device current switching rate.

17. A circuit, comprising:
a switching device having a maximum rated current and comprising a source, a gate, and a drain;
a first voltage supply which applies an output voltage of at least 300 Volts;
a gate driver connected to a second voltage supply and coupled between the source and the gate of the switching device; and
a ferrite bead between an output of the gate driver and the gate of the switching device, the gate driver configured to switch a gate voltage of the switching device at a gate driver switching rate, the gate driver configured such that in operation, an output current of the gate driver cannot exceed a first current level; wherein
the switching device is configured to block the output voltage applied by the first voltage supply during at least a portion of operation of the circuit;
a ratio of the first current level to the maximum rated current of the switching device is less than 1/100; and
in operation of the circuit, a voltage switching rate of the switching device is greater than 100 Volts/nanosecond.

18. The circuit of claim 17, wherein the circuit is a half bridge.

19. The circuit of claim 18, the half bridge being connected to an inductive load, wherein in operation, a current greater than 1 Amp passes through the inductive load.

20. The circuit of claim 17, wherein the second voltage supply applies an output voltage that is substantially less than the output voltage of the first voltage supply.

21. The circuit of claim 20, wherein the second voltage supply applies an output voltage less than 25 Volts.

22. The circuit of claim 17, wherein an output of the gate driver is electrically connected to the gate of the switching device.

23. The circuit of claim 17, further comprising a resistor between an output of the gate driver and the gate of the switching device, wherein the resistor has a resistance between 0 Ohms and 5 Ohms.

24. The circuit of claim 17, wherein the switching device comprises a III-Nitride transistor.

25. The circuit of claim 24, wherein the III-Nitride transistor is a depletion-mode transistor, and the switching device further comprises an enhancement-mode transistor coupled to the III-Nitride transistor.

26. The circuit of claim 17, wherein in operation of the circuit, voltage blocked by the switching device does not exceed 1.5 times the output voltage of the first voltage supply.

27. The circuit of claim 17, wherein in operation of the circuit, voltage blocked by the switching device does not exceed 1.2 times the output voltage of the first voltage supply.

* * * * *